United States Patent [19]
Komori et al.

[11] Patent Number: 5,598,019
[45] Date of Patent: Jan. 28, 1997

[54] SEMICONDUCTOR DEVICE HAVING TRENCH ISOLATION STRUCTURE AND METHOD OF MANUFACTURING THE SAME

[75] Inventors: Shigeki Komori; Takehisa Yamaguchi, both of Hyogo, Japan

[73] Assignee: Mitsubishi Denki Kabushiki Kaisha, Tokyo, Japan

[21] Appl. No.: 223,952

[22] Filed: Apr. 6, 1994

[30]   Foreign Application Priority Data

Apr. 7, 1993  [JP]  Japan ................................. 5-080735
 Mar. 15, 1994  [JP]  Japan ................................. 6-043916

[51] Int. Cl.$^6$ ................................................ H01L 29/76
[52] U.S. Cl. ......................... 257/397; 257/520; 257/640
[58] Field of Search ................................. 257/396–397, 257/520, 640

[56]          References Cited

U.S. PATENT DOCUMENTS

| | | | |
|---|---|---|---|
| 4,520,552 | 6/1985 | Arnould et al. . | |
| 4,571,819 | 2/1986 | Rogers et al. | 257/397 |
| 4,688,069 | 8/1987 | Joy et al. | 257/397 |
| 4,729,964 | 3/1988 | Natsuaki et al. . | |
| 5,359,216 | 10/1994 | Coleman et al. | 257/306 |
| 5,384,280 | 1/1995 | Aoki et al. . | |

FOREIGN PATENT DOCUMENTS

| | | | |
|---|---|---|---|
| 4143209A1 | 7/1993 | Germany . | |
| 60-105247 | 6/1985 | Japan . | |
| 62-214638 | 9/1987 | Japan . | |
| 64-31434 | 2/1989 | Japan . | |
| 1-319969 | 12/1989 | Japan . | |
| 1-309350 | 12/1989 | Japan | 257/397 |
| 2-174139 | 7/1990 | Japan . | |
| 5-13566 | 1/1993 | Japan . | |

OTHER PUBLICATIONS

Tsang, Y., Aitken, J.: Junction Breakdown Instabilities in Deep Trench Isolation Structures, US period.: *IEEE Transactions on Electron Devices*, vol. 38, No. 9, Sep. 1991, pp. 2134 to 2138.
Fazan, P., Mathews, V.: A Highly Manufacturable Trench Isolation Process for Deep Submicron DARMs,: *IEDM 1993*, pp. 57–60.
C. G. Jambotkar, "Improved Polysilicon –Filled Trench Isolation" U. S. Mag.: IBM Technical Disclosure Bulletin, vol. 27, No. 3, Aug. 1984, pp. 1481 to 1482.
B. El–Kareh et al., "Field–Shielded Trench Fill", U.S. Mag.: IBM Technical Disclosure Bulletin, vol. 27, No. 8, Jan. 1985, pp. 4851–4854.
S. D. Malaviya, "Deep Trench Isolation For Bipolar Processes", U.S. Mag.: IBM Technical Disclosure Bulletin, vol. 24, No. 11A, Apr. 1982, pp. 5578 to 5580.
K. D. Beyer et al., "Borosilicate Glass Trench Fill", U.S. Mag.: IBM Technical Disclosure Bulletin, vol. 27, No. 2, Jul. 1984, pp. 1245 to 1247.
Quarter–Micron Selective–Epitaxial–Silicon Refilled Trench (SRT) Isolation Technology With Substrate Shield, M. Aoki et al., pp. 16.2.1–16.2.4, IEDM 91.

*Primary Examiner*—J. Carroll
*Attorney, Agent, or Firm*—Lowe, Price, LeBlanc & Becker

[57]          ABSTRACT

A trench for element isolation is formed on the main surface of a semiconductor substrate. A conductive layer is formed in the trench, electrically connected to the semiconductor substrate. Oxide films and a dielectric film is formed between the conductive layer and the sidewall of the trench. A field oxide film is formed on the conductive layer. The dielectric film extends from the sidewall of the field oxide film to a region between the sidewall of the trench and the conductive layer. Consequently, a semiconductor device having an element isolation structure of superior isolation capability and high reliability can be obtained.

10 Claims, 35 Drawing Sheets 5,598,019

1

SEMICONDUCTOR DEVICE HAVING TRENCH ISOLATION STRUCTURE AND METHOD OF MANUFACTURING THE SAME

BACKGROUND OF THE INVENTION

1. Field of the Invention

The present invention relates to a semiconductor device having a trench isolation structure and a method of manufacturing the same, and particularly to a semiconductor device having a trench isolation structure highly reliable and capable of implementing element isolation of a critical dimension, and a method of manufacturing the same.

2. Description of the Background Art

Recently, with an increasing demand for high integration, a semiconductor device having an element isolation structure of a critical dimension has been required. Conventionally, an LOCOS (Local Oxidation of Silicon) method has been employed as an element isolation method. In isolation by the LOCOS method, however, a bird's beak is formed which makes it difficult to obtain an element isolation of a critical dimension.

Accordingly, a so-called trench isolation technique using a deep narrow trench is focused on as one of element isolation methods capable of implementing element isolation of a critical dimension. One example of the trench isolation technique is disclosed in Japanese Patent Laying-Open No. 60-105247. The trench isolation technique disclosed in Japanese Patent Laying-Open No. 60-105247 will hereinafter be described with reference to FIGS. 50 to 58. FIGS. 50 to 58 are cross sectional views showing an element isolation structure manufactured by the conventional trench isolation technique.

Referring to FIG. 50, a p-type high concentration impurity layer 51 is formed in the main surface of a p-type semiconductor substrate 53, and a p-type low concentration impurity layer 52 is formed on p-type high concentration impurity layer 51. A trench 56 for element isolation is formed in the main surface of p-type semiconductor substrate 53. A polycrystalline silicon layer 60 having p-type impurities introduced is formed in trench 56. An oxide film 58 is formed between polycrystalline silicon layer 60 and the sidewall of trench 56, and a field oxide film 61 is formed at the upper portion of polycrystalline silicon layer 60.

The following effects can be obtained from the above-described structure. Possibility of an inverted layer being provided becomes low, because polycrystalline silicon layer 60 formed in trench 56 has the same potential as p-type semiconductor substrate 53 has, so that the sidewall portion of trench 56 is brought into the state as if a transistor is formed thereon. Specifically, the isolation capability thereof is increased. Additionally, thermal oxidation process is performed for forming field oxide film 61, so that the upper corner portion of polycrystalline silicon layer 60 is simultaneously oxidized, resulting in a rounded shape. Consequently, a substantial distance between the upper corner portion of polycrystalline silicon layer 60 and the sidewall portion of trench 56 becomes longer, whereby formation of an inverted layer due to field concentration at the sidewall portion of trench 56 in the vicinity of the upper corner portion of polycrystalline silicon layer 60 can be effectively prevented. Moreover, polycrystalline silicon layer 60 also has a function to shield an electric field, whereby application of an electric field from an upper wiring to the sidewall of

2 trench 56, and resultant formation of an inverted layer at the sidewall of trench 56 can be effectively prevented.

A method of forming the above-described element isolation structure will now be described with reference to FIGS. 51 to 58. FIGS. 51 to 57 are cross sectional views of the first to seventh steps of the forming process of the above element isolation structure.

Referring to FIG. 51, p-type high concentration impurity layer 51 and p-type low concentration impurity layer 52 are formed, and a silicon oxide film 54 is formed on p-type semiconductor substrate 53 using a thermal oxidation method. p-type impurities are implanted into the main surface of p-type semiconductor substrate 53 through silicon oxide film 54, to form an impurity layer (a channel dope region) 75. A silicon nitride film 55 is formed on silicon oxide film 54.

As shown in FIG. 52, after patterning silicon oxide film 54 and silicon nitride film 55 in a predetermined shape, trench 56 is formed. Through trench 56, boron (B) is diffused in p-type semiconductor substrate 53 to form a p-type high concentration impurity region 57.

As shown in FIG. 53, p-type semiconductor substrate 53 is subjected to thermal oxidation process, so that silicon oxide film 58 is formed on the inner surface of trench 56. As shown in FIG. 54, silicon oxide film 58 is removed only on the bottom surface of trench 56 through etching by an RIE method.

Thereafter, as shown in FIG. 55, a polycrystalline silicon film 59 having boron (B) introduced is formed on the inner surface of trench 56 and silicon nitride film 55. As shown in FIG. 56, polycrystalline silicon layer 60 is etched back so as to be left only in trench 56.

Referring to FIG. 57, field oxide film 61 of a predetermined thickness is formed at the upper portion of polycrystalline silicon layer 60 by thermal oxidation process. At this time, the upper end corner portion of the sidewall of trench 56 is also oxidized. That is, p-type high concentration impurity diffusion layer 57 and impurity layer 75 are oxidized at the upper end corner portion of the sidewall of trench 56. Additionally, in formation of field oxide film 61, p-type impurities are absorbed by field oxide film 61 from p-type high concentration impurity diffusion layer 57 and impurity layer 75 in proximity to field oxide film 61. As a result, the concentration at the upper end corner portion of the sidewall of trench 56 in proximity to field oxide film 61 is reduced.

In order to prevent this, a method can be taken in which impurity layer 75 is formed after forming field oxide film 61. FIG. 58 is cross sectional view showing formation of impurity layer 75 after forming field oxide film 61.

Referring to FIG. 58, even if impurity layer 75 is formed after forming field oxide film 61, p-type impurities for forming impurity layer 75 will not attain a region 81 beneath field oxide film 61, which still results in a low impurity concentration at the upper end corner portion of the sidewall of trench 56 close to field oxide film 61.

Silicon nitride film 55 and silicon oxide film 54 are sequentially removed, whereby the element isolation structure shown in FIG. 50 is formed.

Although the above element isolation structure has a superior isolation capability, there exists the following problem. The problem will be described with reference to FIGS. 59 to 63. FIG. 59 is a perspective view schematically showing an MOS transistor having the conventional element isolation structure described above. FIG. 60 is a cross sectional view taken along the line C—C in FIG. 59. FIG. 61 is an enlarged cross sectional view of the D region in FIG. 60.

Referring to FIG. 59, on a predetermined position of the main surface of a p-type semiconductor substrate 70 is formed an element formation region 72 around which is formed a trench 71 for element isolation. A gate electrode 73 is formed extending on element formation region 72 and trench 71.

The description of a cross sectional structure of the above MOS transistor will be given with reference to FIG. 60. Referring to FIG. 60, p-type semiconductor substrate 70 includes a p-type high concentration impurity layer 70a and a p-type low concentration impurity layer 70b. A trench 71 for element isolation is formed in the main surface of p-type semiconductor substrate 70 so as to attain p-type high concentration impurity layer 70a. Formed in trench 71 is a polycrystalline silicon layer 60 at the upper portion of which a field oxide film 61 is formed. The upper end corner portion of the sidewall of trench 71 is rounded due to formation of field oxide film 61. Gate electrode 73 is formed on trench 71 and element formation region 72, with a gate insulation film 74 interposed therebetween. An n-type impurity region 78 to be a source/drain region is formed on element formation region 72. An MOS transistor 80 is thus structured.

The problem in the MOS transistor having the above-mentioned conventional element isolation structure will now be described with reference to FIG. 61. Referring to FIG. 61, field oxide film 61 is formed by thermal oxidation of the upper portion of polycrystalline silicon layer 60 in the conventional element isolation structure. Therefore, at this time, the upper end corner portion of polycrystalline silicon layer 60 and that of a sidewall 71a of trench 71 are also oxidized, resulting in a rounded shape. Since the upper end corner portion of sidewall 71a of trench 71 is in proximity to field oxide film 61, impurities are absorbed from the upper end corner portion by field oxide film 61 in forming the same. As a result, the p-type impurity concentration of the upper end corner portion of sidewall 71a of trench 71 is reduced.

In the channel region of the MOS transistor of element formation region 72, channel doping is performed for adjusting a threshold voltage of MOS transistor 80 in advance, so that an impurity layer 75 is formed. Impurity layer 75 is formed only in an upper shallow portion of element formation region 72. Therefore, when the upper end corner portion of sidewall 71a of trench 71 has a rounded shape because of thermal oxidation process for forming field oxide film 61 as described above, impurity layer 75 in the vicinity of trench 71 is also oxidized, so that, as shown in FIG. 61, the upper surface of impurity layer 75 is inclined downwardly (in the direction of depth of the trench) in the vicinity of trench 71. Consequently, a region of low impurity concentration where channel doping is not performed exists in a portion opposing gate electrode 73. In the conventional method, therefore, a region 77 having the reduced impurity concentration is formed in the position opposing gate electrode 73 beneath field oxide film 61.

An electric field 76 is applied to reduced impurity concentration region 77 thus formed from gate electrode 73 through field oxide film 61 or gate insulating film 74. At this time, since the upper surface of polycrystalline silicon layer 60 is lower than the main surface of p-type semiconductor substrate 70 as shown in FIG. 61, the electric field 76 from gate electrode 73 can be easily applied to region 77. Such application of the electric field 76 to reduced impurity concentration region 77 from gate electrode 73 results in formation of an inverted layer, i.e. a parasitic transistor.

FIG. 62 is a schematic diagram of an equivalent circuit in the case a parasitic transistor 80a is formed on MOS transistor 80. Referring to FIG. 62, where parasitic transistor 80a is formed because of formation of an inverted layer as described above, a current will flow through parasitic transistor 80a even when no current flows through MOS transistor 80, resulting in a current flow in the circuit including MOS transistor 80. That is, malfunction may be induced. In this case, since parasitic transistor 80a is formed in the region not subjected to channel doping, a parasitic transistor 80a has a low threshold voltage.

FIG. 63 is a graph showing the relation between a voltage (gate voltage Vg) applied to gate electrode 73 of parasitic transistor 80a and MOS transistor 80, and a current (drain current $I_D$) flowing through the drain region. Referring to FIG. 63, since the threshold voltage of parasitic transistor 80a is low as described above, a current flows through parasitic transistor 80a at a voltage not higher than the threshold voltage ($V_{th}$) of MOS transistor 80. The current flow through parasitic transistor 80a thus causes malfunction of MOS transistor 80.

As described above, in the conventional element isolation structure, a parasitic transistor having a low threshold voltage tends to be formed on the upper corner portion of element isolation region 72, whereby such a problem that malfunction of the transistor tends to occur arises. Therefore, an element isolation structure of high reliability cannot be implemented.

SUMMARY OF THE INVENTION

An object of the present invention is to provide a semiconductor device having an element isolation structure of superior element isolation capability and of high reliability, and a method of manufacturing the same.

In one aspect of the present invention, a semiconductor device having a trench isolation structure includes a semiconductor substrate having a main surface; a trench for element isolation, formed in the main surface of the semiconductor substrate; a first insulating layer formed over the trench; a conductive layer formed on the first insulating layer; and a second insulating layer formed on the trench so as to extend from the conductive layer at least to the level of an upper end corner portion of a sidewall of the trench, and having a larger relative dielectric constant than that of the first insulating layer.

In the semiconductor device having the trench isolation structure according to the one aspect of the present invention, the second insulating layer having a higher relative dielectric constant is formed extending from the conductive layer at least to the level of an upper end corner portion of the sidewall of the trench, so that an electric field from the conductive layer which has already been weakened by the second insulating layer is applied to the upper end corner portion of the sidewall of the trench where an inverted layer may have been formed in a conventional method. Therefore, formation of such an inverted layer, i.e. formation of a parasitic transistor, can be effectively prevented.

In another aspect of the present invention, a semiconductor device having a trench isolation structure includes a semiconductor substrate having a main surface; a trench for element isolation, formed in the main surface of the semiconductor substrate; a first conductive layer formed apart from a sidewall of the trench by a predetermined space, electrically connected to the semiconductor substrate at a bottom of the trench, and having an upper surface not lower than the main surface of the semiconductor substrate; an insulating layer formed on the first conductive layer; and a second conductive layer formed on the insulating layer.

In the semiconductor device having the trench isolation structure in accordance with another aspect of the present invention, the upper surface of the first conductive layer is defined not lower than the main surface of the semiconductor substrate, so that a distance between a region where a parasitic transistor would have been formed in a conventional method and the second conductive layer can be made larger, and thus, effects of an electric field from the second conductive layer can be decreased. Consequently, possibility of formation of a parasitic transistor can be reduced compared to the conventional method. Moreover, in the conventional method where the upper end corner portion of the first conductive layer is lower than the main surface of the semiconductor substrate, an inverted layer might be formed by concentration of the electric field, on the element formation region in the vicinity of the upper end corner portion of the first conductive layer. To the contrary, according to the present invention, since the upper surface of the first conductive layer is not lower than the main surface of the semiconductor substrate, formation of an inverted layer for the above reason can be effectively prevented. Furthermore, since the electric field from the second conductive layer applied to the upper end corner portion of the sidewall of the trench can be shielded by the first conductive layer itself, an inverted layer cannot be easily formed at the upper end corner portion of the sidewall of the trench compared to the conventional method.

In still another aspect of the present invention, a semiconductor device having a trench isolation structure includes a semiconductor substrate of a first conductivity type having a main surface; a trench for element isolation, formed surrounding a predetermined region of the main surface of the semiconductor substrate; a first conductive layer formed apart from a sidewall of the trench by a predetermined space, and electrically connected to the semiconductor substrate at a bottom of the trench; a first insulating layer formed on the first conductive layer; a second conductive layer formed extending from the first insulating layer to the predetermined region of the main surface of the semiconductor substrate; a second insulating layer formed over the trench so as to extend at least from the second conductive layer to the level of the main surface of semiconductor substrate, and having relative a dielectric constant higher than that of the first insulating layer; a channel region formed on the main surface of the semiconductor substrate beneath the second conductive layer; and a pair of impurity regions of a second conductivity type formed on the main surface of the semiconductor substrate so as to sandwich the channel region. On the surface of the channel region formed is a channel-doped region having a flat upper surface.

In the semiconductor device having the trench isolation structure in accordance with the still another aspect of the present invention, the channel-doped region has a flat upper surface, because the channel-doped region in the vicinity of the upper end corner portion of the sidewall of the trench is hardly oxidized in formation of the first insulating layer by thermal oxidization. In the conventional method, the channel-doped region in the vicinity of the upper end corner portion of the sidewall of the trench is oxidized in forming the first insulating layer by thermal oxidation, so that the upper surface of the channel-doped region is inclined in the vicinity of the upper end corner portion of the sidewall of the trench, and a region of low impurity concentration where channel-doping is not performed is formed at a position opposing the second conductive layer, resulting in formation of an inverted layer on the region of low impurity concentration due to an electric field from the second conductive layer. To the contrary, according to the present invention, the flat surface of the channel-doped region prevents a low impurity concentration region where channel-doping is not performed from being formed at the position opposing the second conductive layer, which enables reduction in possibility of formation of an inverted layer, i.e. possibility of formation of a parasitic transistor, compared to the conventional method. In addition, the second insulating layer effectively prevents formation of an inverted layer at the upper end corner portion of the sidewall of the trench, as in the one aspect of the present invention described above.

In the one aspect of the present invention, a method of manufacturing the semiconductor device having the trench isolation structure includes the steps of: forming a first dielectric film on a main surface of a semiconductor substrate; forming, after patterning the first dielectric film in a predetermined configuration, a trench for element isolation in the main surface of the semiconductor substrate by etching with the first dielectric film as a mask; forming a second dielectric film so as to cover an inner surface of the trench and the first dielectric film; exposing an upper surface of the first dielectric film and a part of a bottom of the trench by anisotropical etching of the second dielectric film; forming a first conductive layer so as to cover the inner surface of the trench and the first and second dielectric films; etching back the first conductive layer so as to make the upper surface of the first conductive layer and the upper surface of the first and second dielectric films substantially at the same height; forming an insulating layer having a lower relative dielectric constant than those of the first and second dielectric films on the first conductive layer; etching the first dielectric film away; forming a third dielectric film having a higher relative dielectric constant than that of the insulating layer all over the main surface of the semiconductor substrate; and anisotropically etching the third dielectric film so as to leave the third dielectric film on a sidewall of the insulating layer.

In the method of manufacturing the semiconductor device having the trench isolation structure in accordance with the one aspect of the present invention, the dielectric film including the second and third dielectric films, and having a higher relative dielectric constant can be formed extending from the second conductive layer to a region between the first conductive layer and the sidewall of the trench, so that the semiconductor device having the trench isolation structure can be implemented where an inverted layer cannot be easily formed at the upper corner portion of the sidewall of the trench.

When the first conductive layer is formed of a polycrystalline silicon layer and the insulating layer is formed by thermal oxidation of the upper surface of the first conductive layer, the first and second dielectric films serve as a mask in the thermal oxidation. That is, the first and the second dielectric films exist between the first insulating layer and the main surface of the semiconductor substrate. This effectively prevents impurities from being absorbed from the upper end corner portion of the sidewall of the trench by the first insulating layer in formation of the first insulating layer, and thus, effectively prevents reduction in the concentration of the upper end corner portion of the sidewall of the trench. Consequently, an inverted layer cannot be easily formed at the upper end corner portion of the sidewall of the trench.

The upper end corner portion of the sidewall of the trench is covered with the first and second dielectric films in formation of the first insulating layer, so that oxidation of the upper end corner portion of the sidewall of the trench is effectively prevented in thermal oxidation for forming the first insulating layer. This effectively prevents formation of a region of low impurity concentration at a position opposing the second conductive layer due to oxidation of the upper end corner portion of the sidewall of the trench, thereby suppressing formation of an inverted layer at the upper end corner portion of the sidewall of the trench.

The surface of the first and second dielectric films is exposed by etching back the first conductive layer. At this time, the upper surface of the first conductive layer and that of the first and second dielectric films are made to be substantially at the same height. This enables the upper surface of the first conductive layer to be not lower than the main surface of the semiconductor substrate in forming the first insulating layer on the first conductive layer in later process. Specifically, the upper surface of the first conductive layer can be made not lower than the main surface of the semiconductor substrate by making the thickness of the first insulating layer substantially the same or smaller than the thickness of the first dielectric film. Consequently, formation of an inverted layer due to field concentration which might be occur when the upper surface of the first conductive layer is lower than the main surface of the semiconductor substrate is effectively prevented.

The third dielectric film is subjected to anisotropical etching to be left on the sidewall of the first insulating layer, so that, when a second conductive layer is formed extending from the element formation region over the first insulating layer, an electrical short between the first and second conductive layers can be prevented.

In the another aspect of the present invention, a method of manufacturing the semiconductor device having the trench isolation structure includes the steps of: forming a first dielectric film on a main surface of a semiconductor substrate; forming, after patterning the first dielectric film in a predetermined configuration, a trench for element isolation in the main surface of the semiconductor substrate by etching with the first dielectric film as a mask; forming a first insulating layer having a lower relative dielectric constant than that of the first dielectric film, on an inner surface of the trench and on the first dielectric film; anisotropically etching the first insulating layer, to expose an upper surface of the first dielectric film and a part of a bottom of the trench; forming a conductive layer so as to cover the inner surface of the trench and the first dielectric film; etching back the conductive layer so as to make the upper surface of the conductive layer and the upper surface of the first dielectric film substantially at the same height; etching the first insulating layer so as to lower the upper surface of the first insulating layer to the height of the main surface of the semiconductor substrate; forming a second dielectric film having a higher relative dielectric constant than that of the first insulating layer so as to cover the first dielectric film, the conductive layer and the first insulating layer; etching back the second dielectric film so that the surface of the first dielectric film and the surface of the conductive layer are exposed and the second dielectric film is left on the first insulating layer; forming a second insulating layer having a lower relative electric constant than those of the first and second dielectric films; and anisotropically etching the first and second dielectric films so that the second dielectric film is left on the sidewall of the second insulating layer.

In the method of manufacturing the semiconductor device having the trench isolation structure in accordance with the another aspect of the present invention, the second dielectric film can be formed extending from the second conductive layer to the upper end corner portion of the sidewall of the trench, so that the semiconductor device having the trench isolation structure can be implemented in which an inverted layer cannot be easily formed at the upper end corner portion of the sidewall of the trench, as in the one aspect stated above. Also in this aspect, since the first and second dielectric films exist between the second insulating layer and the main surface of the semiconductor substrate, impurities are effectively prevented from being absorbed from the upper end corner portion of the sidewall of the trench in thermal oxidation for forming the second insulating layer, as well as the upper end corner portion of the sidewall of the trench is prevented from being oxidized. In addition, as in the one aspect, the upper surface of the first conductive layer can be made not lower than the main surface of the semiconductor substrate.

In the still another aspect of the present invention, a method of manufacturing the semiconductor device having the trench isolation structure includes the steps of: forming a first dielectric film on a main surface of a semiconductor substrate; forming, after patterning the first dielectric film in a predetermined configuration, a trench for element isolation in the main surface of the semiconductor substrate by etching with the first dielectric film as a mask; forming a first insulating layer having a lower relative dielectric constant than that of the first dielectric film, on an inner surface of the trench and on the first dielectric film; anisotropically etching the first insulating layer to expose an upper surface of the first dielectric film and a part of a bottom of the trench; forming a conductive layer so as to cover the inner surface of the trench and the first dielectric film; etching back the conductive layer to expose the surface of the first dielectric film; forming a second insulating layer having a lower relative dielectric constant than that of the first dielectric film on the conductive layer; and etching the first dielectric film away.

In the method of manufacturing the semiconductor device having the trench isolation structure in accordance with the still another aspect of the present invention, existence of the first dielectric film enables the upper surface of the first conductive layer to be made substantially at the same height as that of the upper surface of the first dielectric film when the first conductive layer is etched back. The second insulating layer is formed on the first conductive layer. At this time, even when the first conductive layer is formed of a polycrystalline silicon layer, and the second insulating layer is formed by thermal oxidation of the upper surface of the first conductive layer, the bottom surface of the second insulating layer can be made not lower than the main surface of the semiconductor substrate by appropriately adjusting the thicknesses of the first dielectric film and the second insulating layer. Consequently, the upper surface of the first conductive layer can be made not lower than the main surface of the semiconductor substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (First embodiment)

Figure 1:
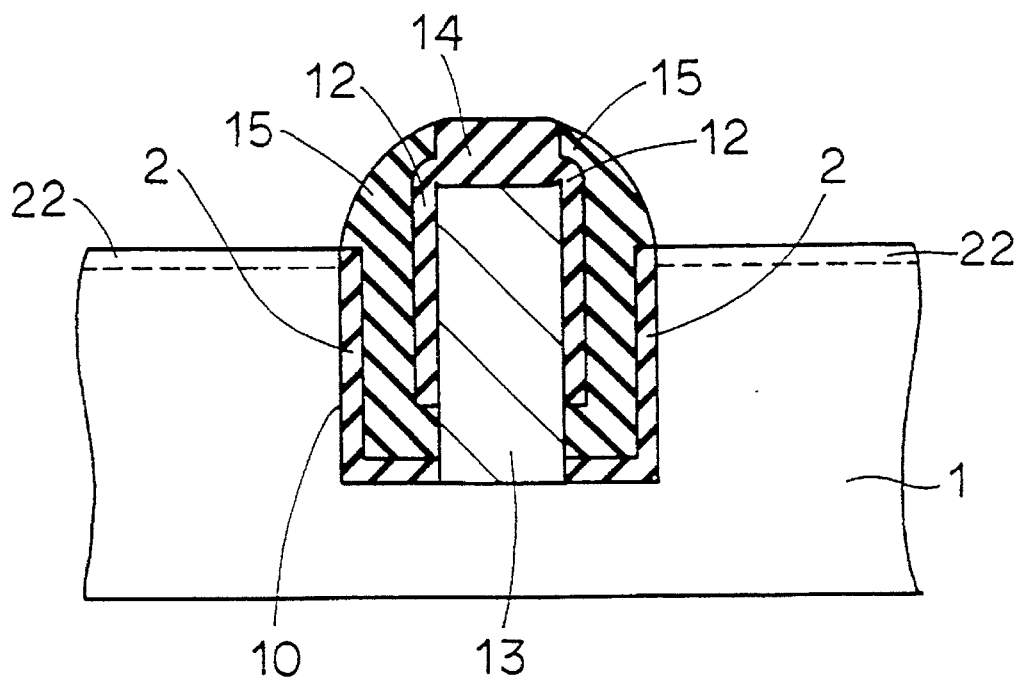
FIG. 1 is a cross sectional view showing an element isolation structure in accordance with a first embodiment of the present invention.

FIG. 1 is a cross sectional view showing an element isolation structure (trench isolation structure) in accordance with a first embodiment of the present invention. Referring to FIG. 1, a trench 10 for element isolation is formed in the main surface of a p-type semiconductor substrate (p-type silicon substrate). A channel doped layer (impurity layer) 22 is formed in the main surface of a p-type semiconductor substrate 1. In trench 10, a conductive layer 13 is formed, which is electrically connected to p-type semiconductor substrate 1. An oxide film (silicon oxide film) 12, a dielectric film 15, and an oxide film (silicon oxide film) 2 are respectively formed between conductive layer 13 and the sidewall of trench 10. Each of oxide film 12 and oxide film 2 should have at least the thickness sufficient to function as a stress buffering film, preferably the thickness of 20–100 Å, approximately. The thickness of dielectric film 15 is preferably not more than approximately 300 Å when a nitride film (silicon nitride film) is used as dielectric film 15. In the embodiments to be hereinafter described, a nitride film is used as dielectric film 15, and a polycrystalline silicon layer having impurities introduced is used as conductive layer 13.

A field oxide film 14 made of a silicon oxide film or the like is formed on conductive layer 13. Nitride film 15 is formed so as to have one end on the sidewall of field oxide film 14. Metal silicide may be used as material for conductive layer 13. Material having a higher relative dielectric constant than that of the silicon oxide film, such as tantalum oxide ($Ta_2O_5$) and lead zirconate-titanate PZT dielectric material may be used for dielectric film 15.

Figure 23:
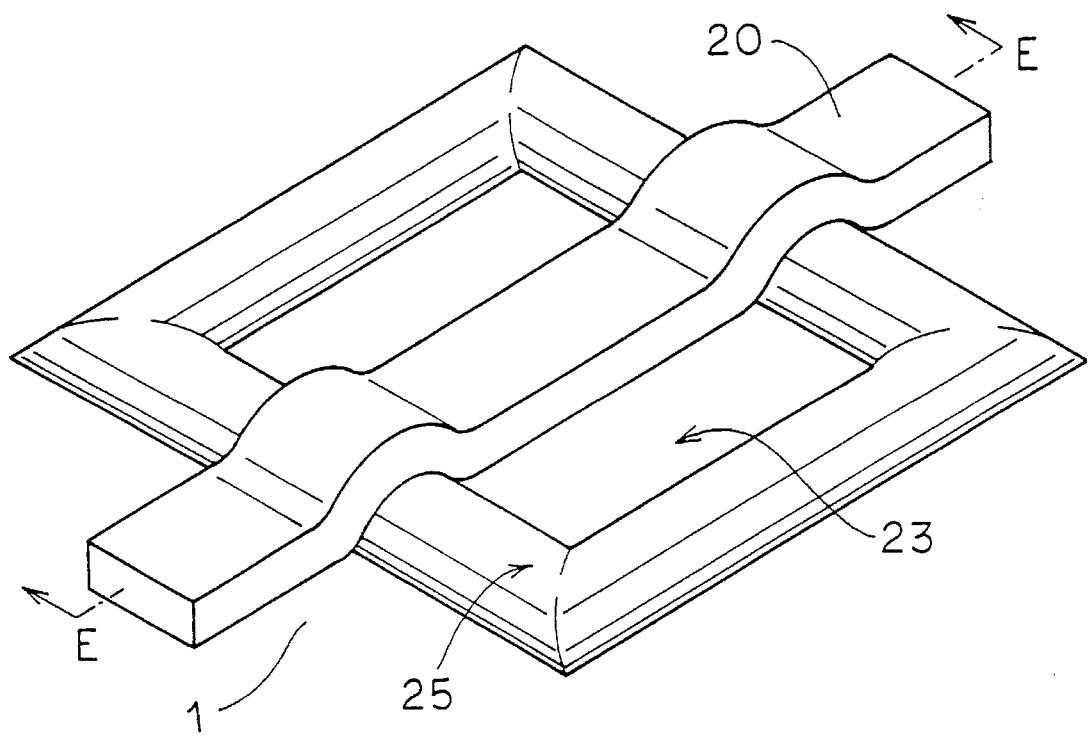
FIG. 23 is a perspective view of a MOS transistor employing the element isolation structure in accordance with the first embodiment of the present invention.
Figure 24:
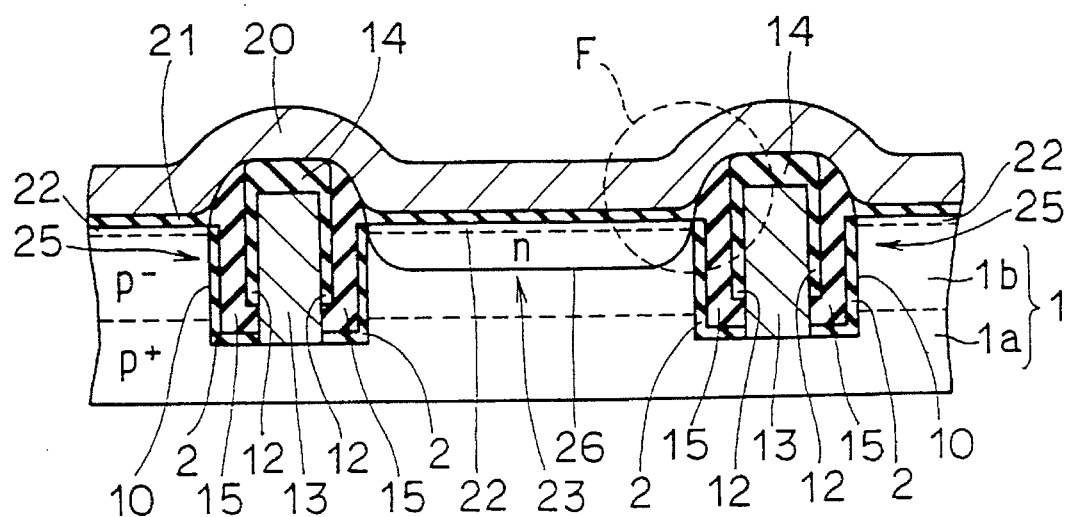
FIG. 24 is a cross sectional view taken along the line E—E in FIG. 23.
Figure 25:
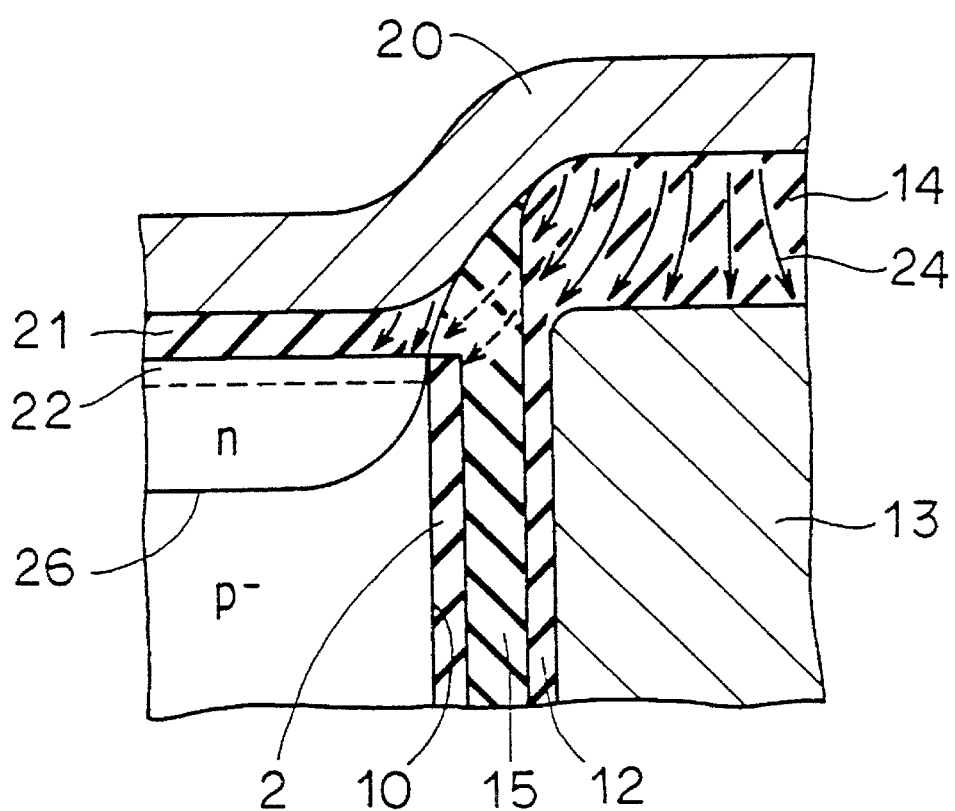
FIG. 25 is an enlarged cross sectional view of the F region in FIG. 24.
Figure 59:
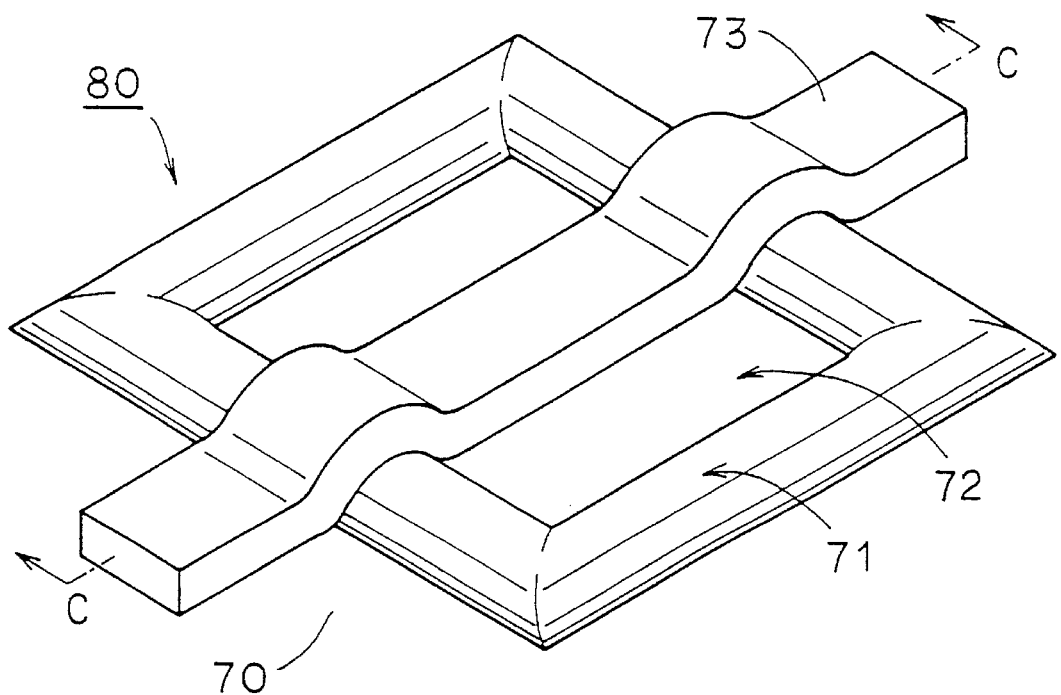
FIG. 59 is a perspective view of a MOS transistor employing the conventional element isolation structure.
Figure 60:
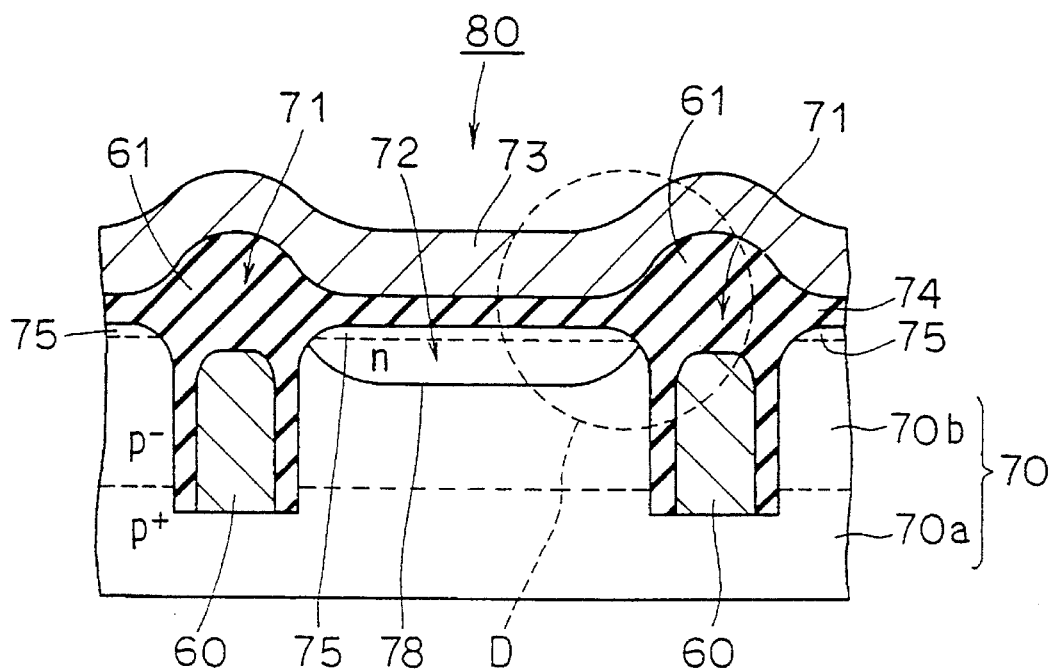
FIG. 60 is a cross sectional view taken along the line C—C in FIG. 59.
Figure 61:
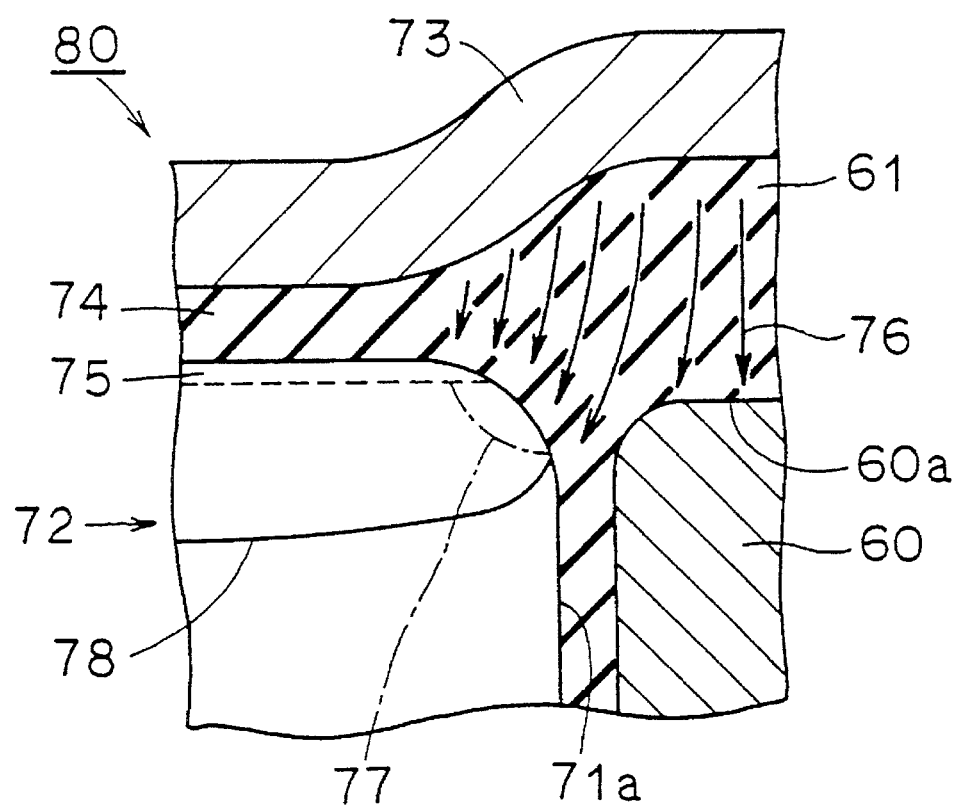
FIG. 61 is an enlarged cross sectional view of the D region in FIG. 60.
Figure 62:
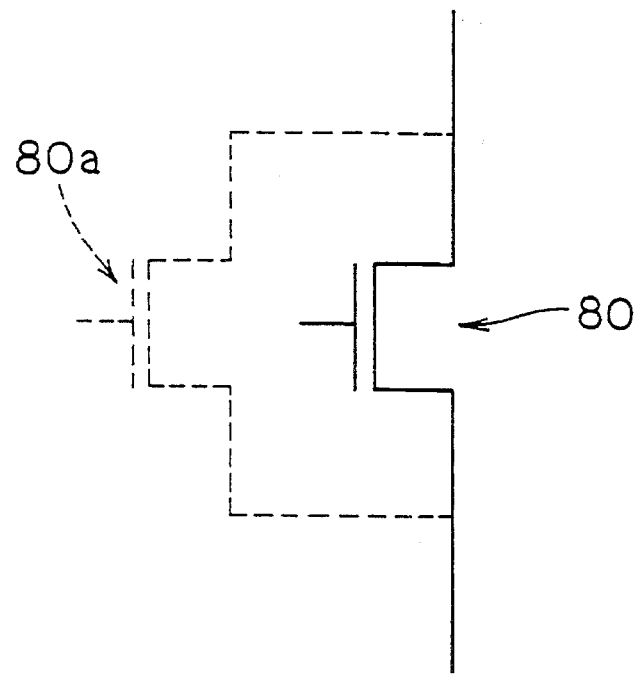
FIG. 62 is a schematic diagram of an equivalent circuit showing formation of a parasitic transistor.
Figure 63:
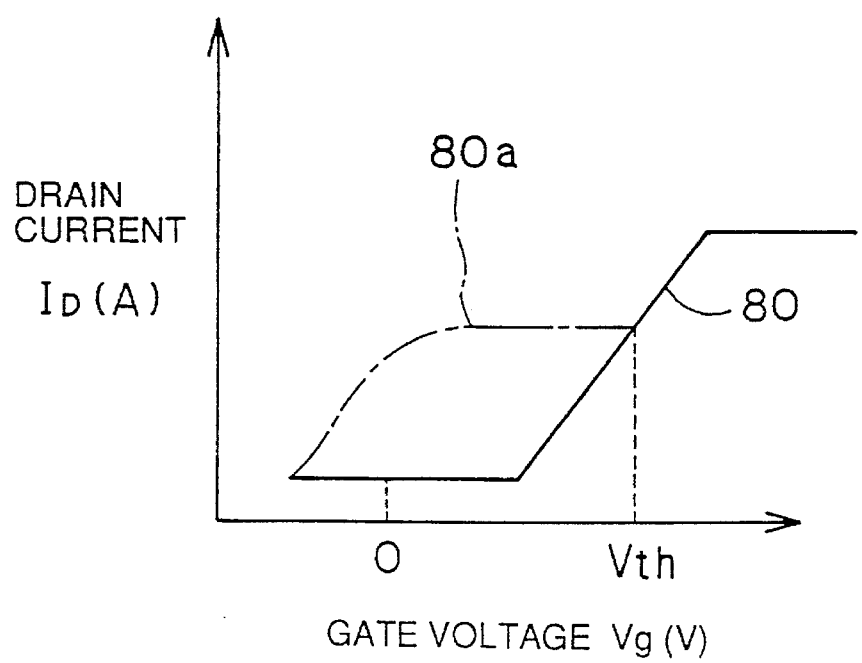
FIG. 63 is a graph showing the relation between a drain current $I_D$ and a gate voltage $V_g$ in the case of a parasitic transistor being formed.

Application of the element isolation structure in accordance with the present invention to a MOS transistor, as well as the function of the present invention, will be described with reference to FIGS. 23 to 25. FIG. 23 is a perspective view of a MOS transistor employing the element isolation structure in accordance with the present invention, corresponding to FIG. 59 with respect to the conventional structure. FIG. 24 is a cross sectional view taken along the line E—E in FIG. 23, corresponding to FIG. 60 with respect to the conventional structure. FIG. 25 is an enlarged cross sectional view of the F region in FIG. 24, corresponding to FIG. 61 with respect to the conventional structure.

Referring to FIG. 23, in the main surface of p-type semiconductor substrate 1 is formed an element formation region 23 around which a trench 25 for element isolation is formed. A gate electrode 20 is formed extending on element formation region 23 and trench 25. Referring to FIG. 24, a p-type semiconductor substrate 1 includes a p-type high concentration impurity layer 1a and a p-type low concentration impurity layer 1b. An n-type impurity region 26 to be a source/drain region is formed in element formation region 23.

In trench 25, polycrystalline silicon layer 13 is formed electrically connected to p-type semiconductor substrate 1 at its bottom surface. Field oxide film 14 is formed on polycrystalline silicon layer 13, and oxide film 12 is formed on the side of polycrystalline silicon layer 13. Nitride film 15 is formed to surround oxide film 12 and to have one end on the sidewall of field oxide film 14. Oxide film 2 is formed on the sidewall of trench 25 to surround nitride film 15. Gate electrode 20 is formed extending on trench 25 and element formation region 23 with gate insulating film 21 made of a silicon oxide film or the like interposed therebetween.

Referring to FIG. 25, the function in application of the element isolation structure in accordance with the present invention to the MOS transistor thus structured will be described. Referring to FIG. 25, n-type impurity region 26 to be the source/drain region is formed to define the channel region in the element formation region. The channel region is subjected to channel doping for controlling the threshold voltage of the MOS transistor. Consequently, an impurity layer 22 is formed in the channel region.

In the conventional case, a bird's beak on the end of the element formation region results from forming field oxide film 14. As a result, a parasitic transistor is formed by the electric field 24 from gate electrode 20 on the portion not subjected to channel doping in the element formation region. In the element isolation structure in accordance with the present invention, however, since nitride film 15 is formed extending from the sidewall of trench 10 to the sidewall of field oxide film 14, a bird's beak can hardly be formed on the upper end corner portion of trench 10. Therefore, a region of low impurity concentration not subjected to channel doping does not exist at the position opposing gate electrode 20.

The electric field 24 applied to the upper end corner portion of the sidewall of trench 10 is weakened due to existence of nitride film 15 and polycrystalline silicon layer 13. This effectively prevents formation of an inverted layer at the upper end corner portion of the sidewall of trench 10. Consequently, the element isolation structure of high reliability can be obtained.

A method of forming the element isolation structure in accordance with the first embodiment of the present invention will be described with reference to FIGS. 2 to 14. FIGS. 2 to 14 are cross sectional views showing the first to thirteenth steps of a process of forming the element isolation structure of the first embodiment of the present invention.

Figure 2:
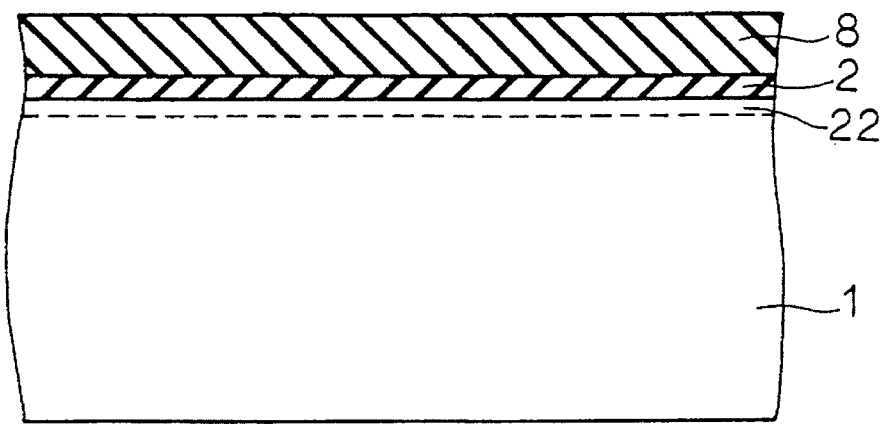
FIGS. 2 to 14 are cross sectional views showing the first to thirteenth steps of a process of forming the element isolation structure in accordance with the first embodiment of the present invention.

Referring to FIG. 2, an oxide film 2 of approximately 500 Å in thickness is formed, and p-type impurities for channel doping are injected into the main surface of p-type semiconductor substrate 1 through oxide film 2, to form a p-type impurity layer 22. A nitride film (first dielectric film) 8 made of a silicon nitride film and having the thickness of 1000 to 3000 Å is formed.

Figure 3:
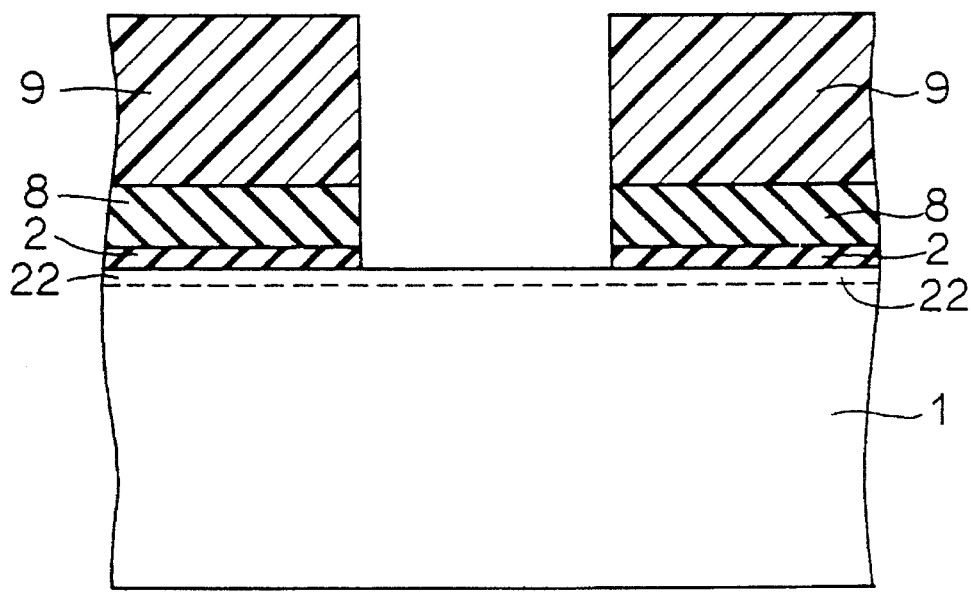

Referring to FIG. 3, a resist 9 is applied on the whole surface of nitride film 8, and then, patterned into a predetermined shape. Nitride film 8 and oxide film 2 are etched into a predetermined pattern using resist 9 as a mask.

Figure 4:
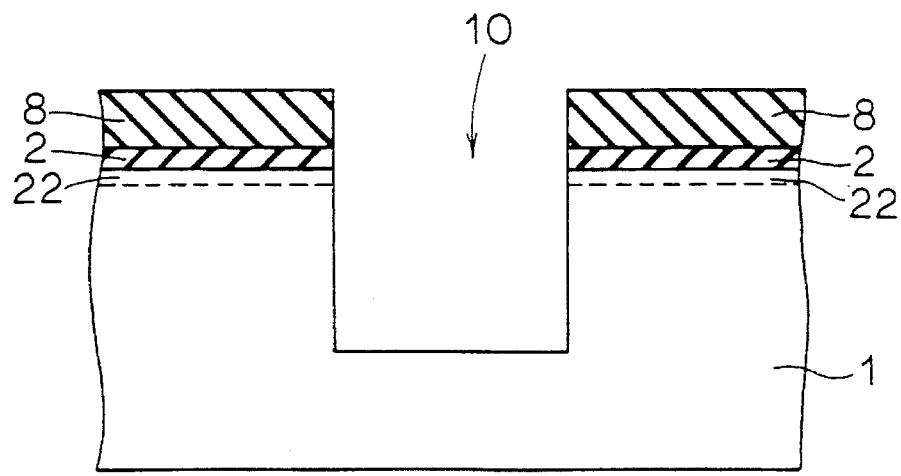
Figure 5:
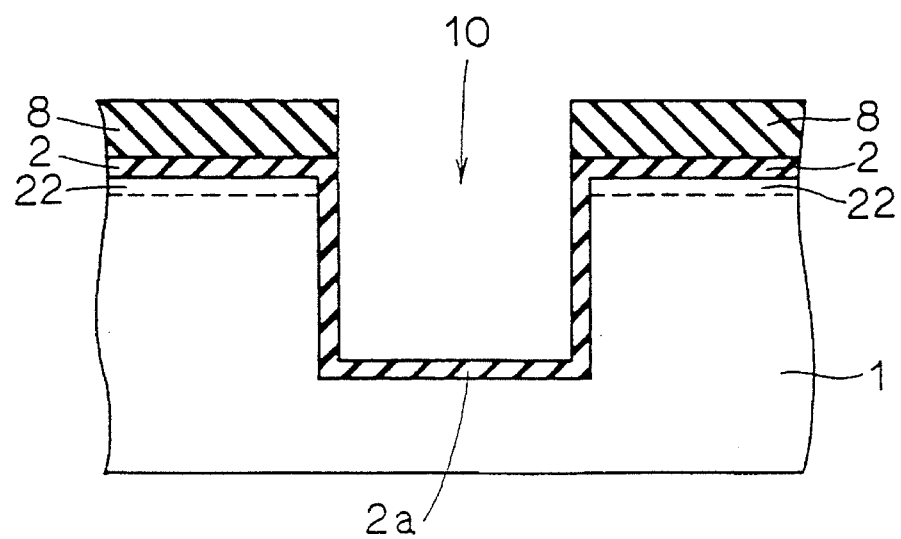

As shown in FIG. 4, a trench 10 of approximately 0.5–1 μm in depth is formed by anisotropic etching with nitride film 8 and oxide film 2 as a mask. Referring to FIG. 5, an oxide film 2a having the thickness of not more than approximately 100 Å is formed on the sidewall and the bottom portion of trench 10 by thermal oxidation process or a CVD method. Oxide film 2a serves as a stress buffering film.

Figure 6:
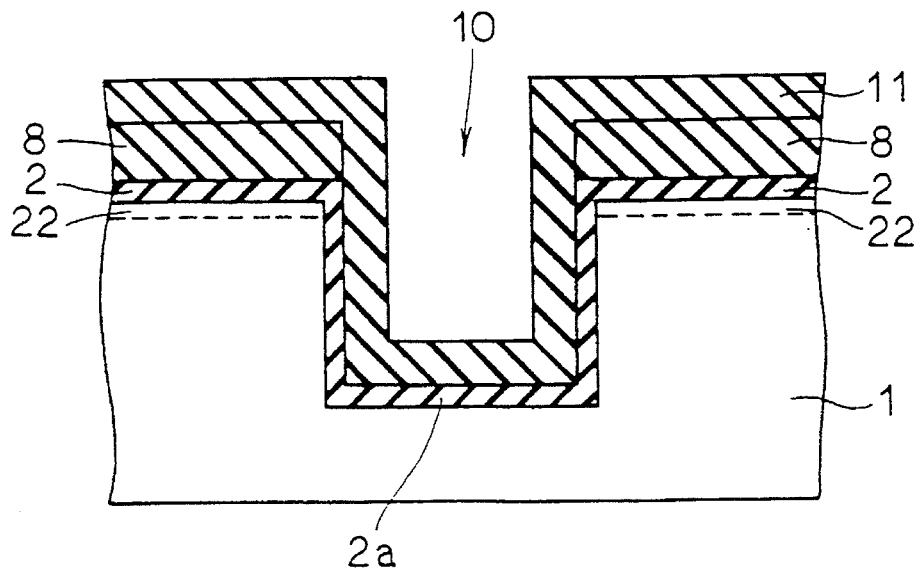
Figure 7:
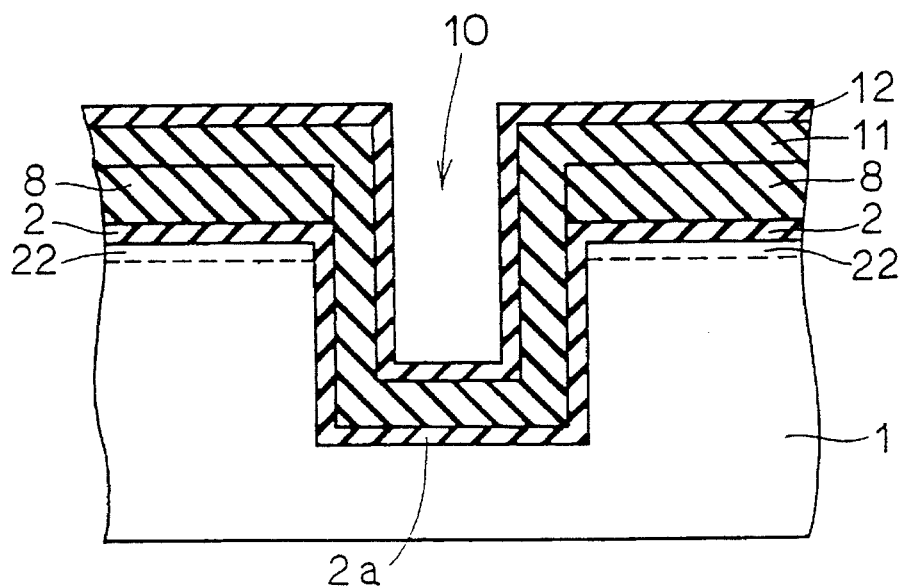

Referring to FIG. 6, a nitride film made of a silicon nitride film or the like (second dielectric film) 11 having the thickness of not more than approximately 300 Å is formed on oxide film 2a and nitride film 8 by a CVD method. Material for the second dielectric film may be different from that for the first dielectric film. Referring to FIG. 7, oxide film 12 having the thickness of not more than approximately 100 Å is formed on nitride film 11 by a CVD method or thermal oxidation process.

Figure 8:
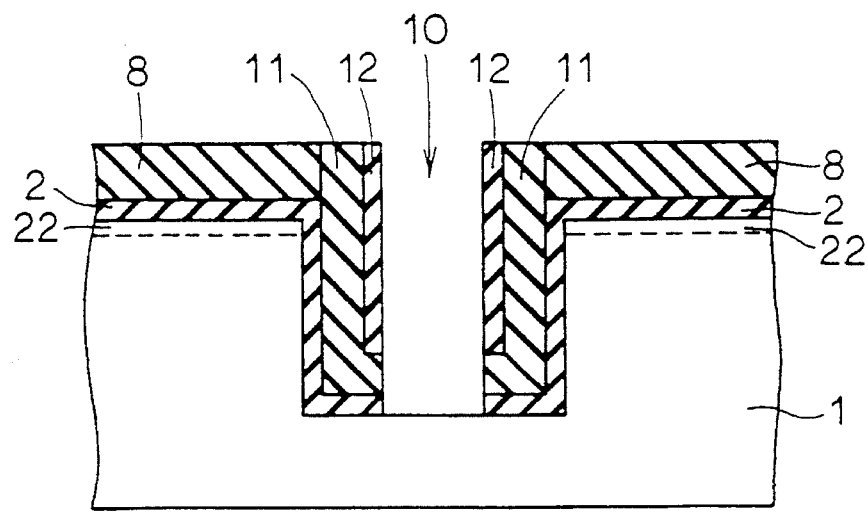

Referring to FIG. 8, oxide film 12, nitride film 11, and oxide film 2a are sequentially subjected to anisotropic etching process. As a result, oxide film 12, nitride film 11, and oxide film 2a on the bottom portion of trench 10 are etched, so that the surface of p-type semiconductor substrate 1 is exposed. At this time, a part of nitride film 11 and a part of oxide film 12 are left on the sidewall of trench 10.

Figure 9:
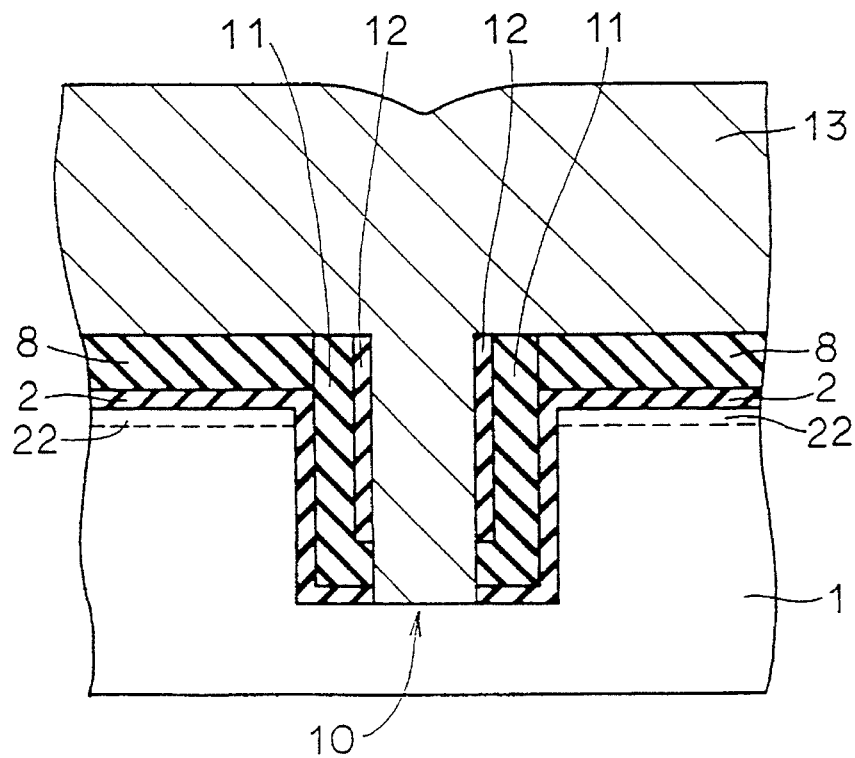

Referring to FIG. 9, conductive layer 13, i.e. polycrystalline silicon layer 13 in this case, is formed by a CVD method. In this case, the thickness of polycrystalline silicon layer 13 is preferably one and a half times larger than the opening width of trench 10, approximately, so that trench 10 can be filled with polycrystalline silicon layer 13. Polycrystalline silicon layer 13 has a predetermined amount of p-type impurities introduced so as to have conductivity.

Figure 10:
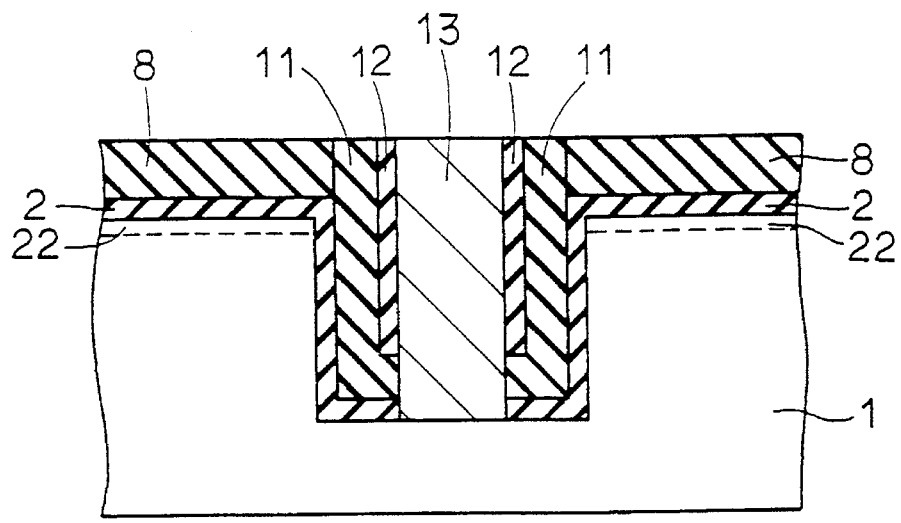

Referring to FIG. 10, polycrystalline silicon layer 13 is etched back. At this time, the etching back is preferably performed so that the upper surface of nitride film 8 and nitride film 11 and the upper surface of polycrystalline silicon layer 13 are substantially coplanar. This enables, in the subsequent step of forming a field oxide film on polycrystalline silicon layer 13, the height of the upper surface of polycrystalline silicon layer 13 after formation of the field oxide film to be adjusted by the thickness of nitride film 8. Specifically, the upper surface of polycrystalline silicon layer 13 after formation of the field oxide film can be adjusted not lower than the main surface of p-type semiconductor substrate 1 by making the thickness of the field oxide film not more than the thickness of nitride film 8. Consequently, formation of an inverted layer due to field concentration, which may occur when the upper surface of polycrystalline silicon layer 13 is lower than the main surface of p-type semiconductor substrate 1, can be effectively prevented.

Figure 11:
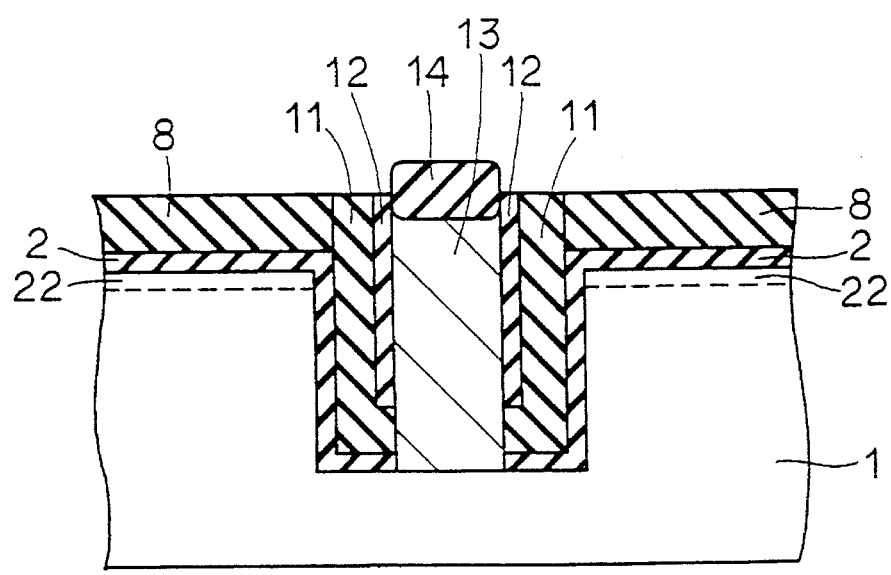

Referring to FIG. 11, field oxide film 14 is formed on polycrystalline silicon layer 13 by thermal oxidation process with nitride films 8 and 11 as a mask. The thickness of field oxide film 14 is made approximately equal to that of nitride film 8, and preferably, 1000–3000 Å, approximately. At this time, a bird's beak can hardly be formed on the upper end corner portion of the sidewall of trench 10 because of nitride films 8 and 11 formed covering the upper end corner portion of the sidewall of trench 10. Existence of nitride films 8 and 11 prevents impurities from being absorbed from the upper end corner portion of the sidewall of trench 10 because of formation of field oxide film 14, whereby a region of low impurity concentration cannot be formed at the upper end corner portion of the sidewall of trench 10. After forming field oxide film 14, a thin oxide film formed on nitride films 11 and 8 is removed by wet etching with hydrogen fluoride (HF) or the like.

Figure 12:
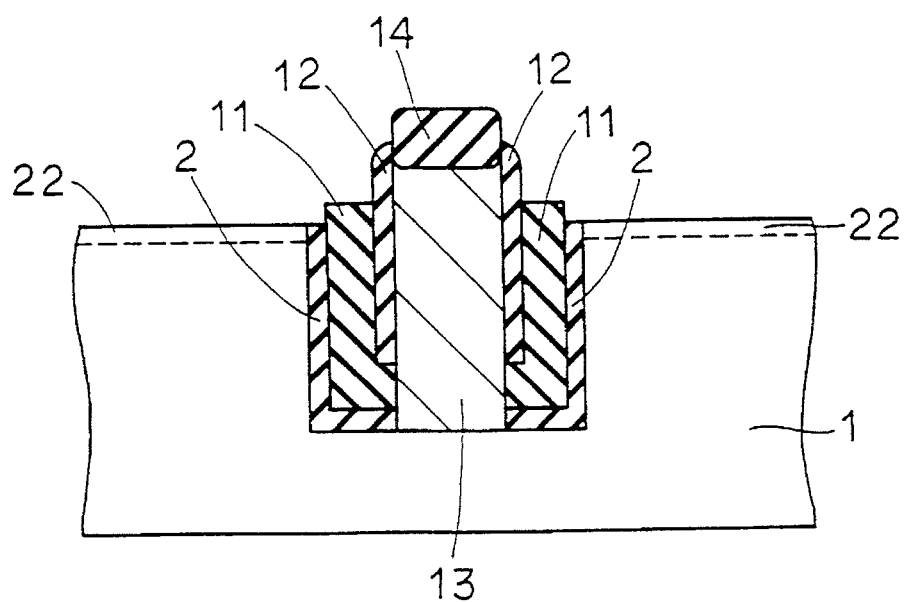
Figure 13:
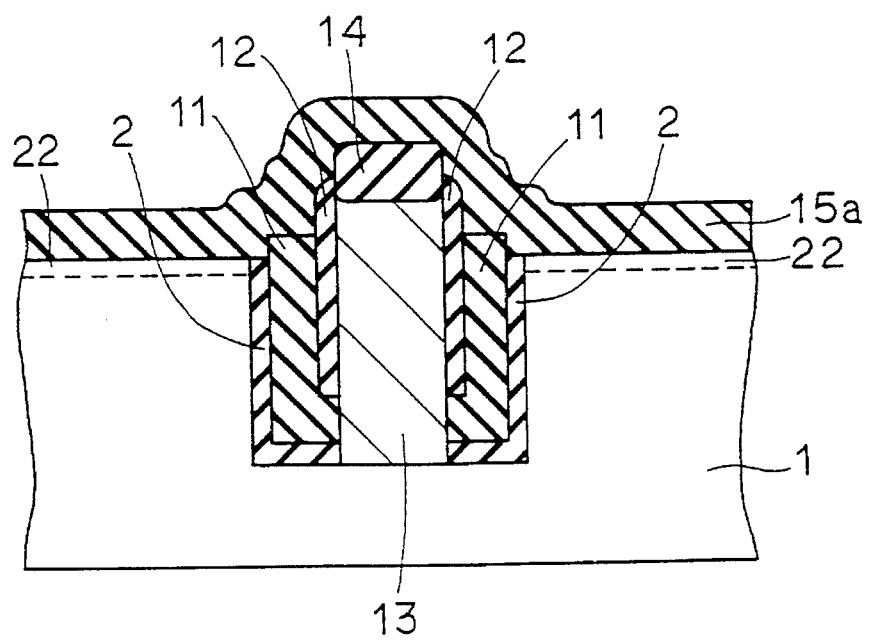
Figure 14:
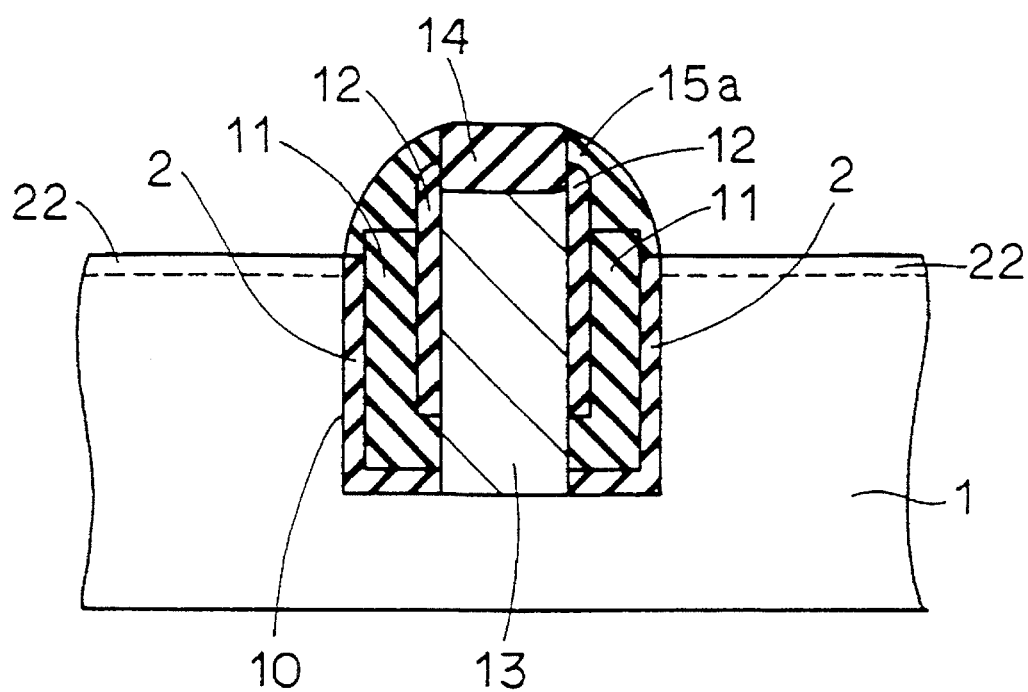

Referring to FIG. 12, anisotropic etching process is applied to nitride films 8 and 11, and thereafter, is applied to oxide film 2. It is preferable that such a condition is selected that etching of field oxide film 14 is suppressed in the etching of nitride films 8 and 11. As a result, the main surface of p-type semiconductor substrate 1 is exposed in the element formation region with field oxide film 14 being hardly etched. Referring to FIG. 13, a nitride film (third dielectric film) 15a is deposited on the whole surface of p-type semiconductor substrate 1 by a CVD method. Material for the third dielectric film may be different from that for the first or second dielectric film. As shown in FIG. 14, nitride film 15a is formed on the sidewall of field oxide film 14 by anisotropic etching process. Consequently, nitride film 15 having one end on the sidewall of field oxide film 14 as shown in FIG. 1 is formed. Thereafter, through the steps of forming a gate insulating layer, a gate electrode, an impurity region and the like, the MOS transistor shown in FIGS. 23 to 25 is formed.

Since nitride film 15 is formed to have one end on the sidewall of field oxide film 14 as described above, when a wiring layer, such as a gate electrode, is formed extending on field oxide film 14 and the element formation region, an electrical short between polycrystalline silicon layer 13 and the wiring layer can be prevented.

(Second embodiment)

Figure 15:
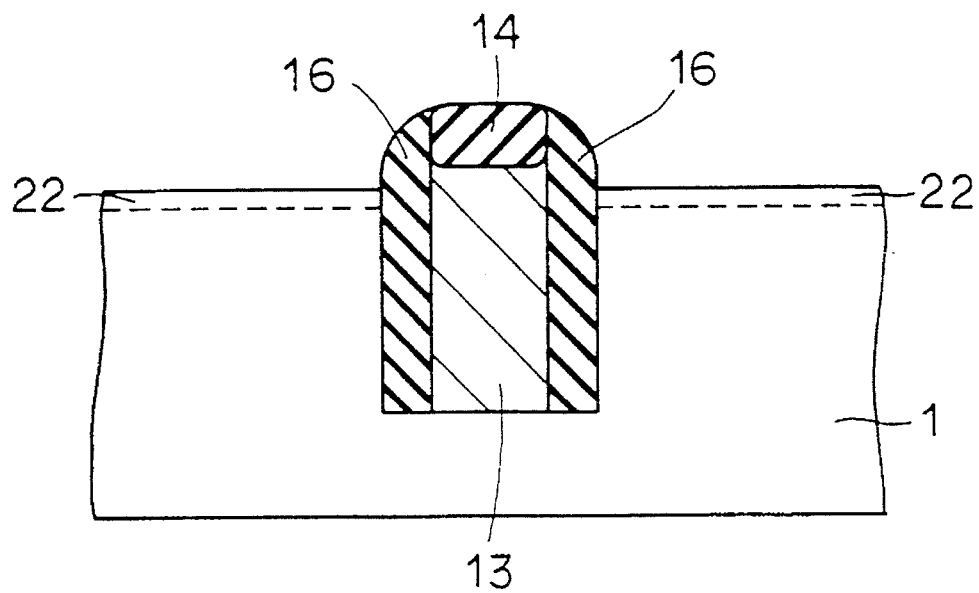
FIG. 15 is a cross sectional view showing an element isolation structure in accordance with a second embodiment of the present invention.
Figure 16:
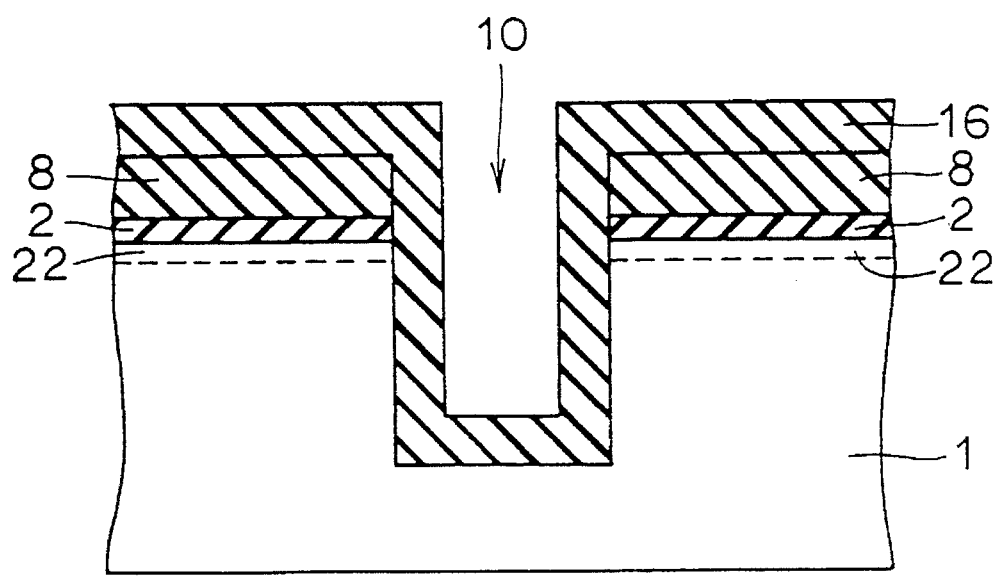
FIGS. 16 to 18 are cross sectional views showing the fourth to sixth steps of a process of forming the element isolation structure in accordance with the second embodiment of the present invention.
Figure 17:
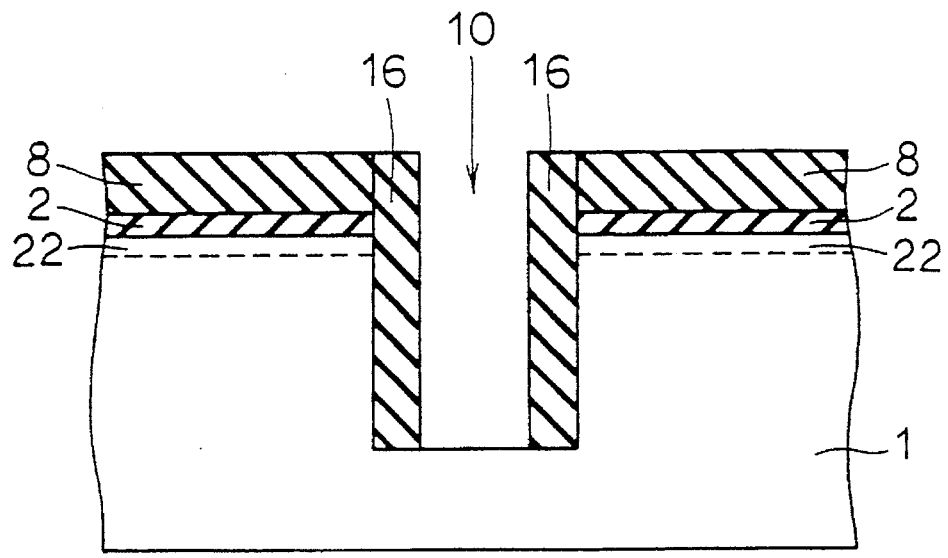
Figure 18:
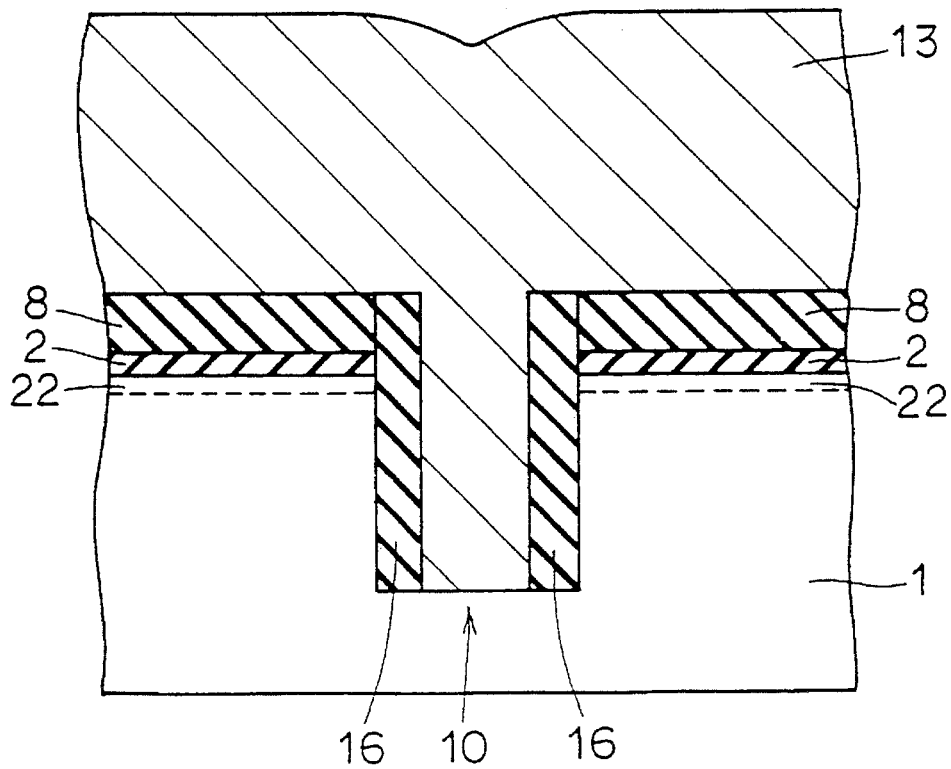

An element isolation structure in accordance with a second embodiment of the present invention will be described with reference to FIGS. 15 to 18. FIG. 15 is a cross sectional view of an element isolation structure in accordance with a second embodiment of the present invention. FIGS. 16 to 18 are cross sectional views showing the fourth to sixth steps of a process of forming the element isolation structure in accordance with the second embodiment of the present invention. Referring to FIG. 15, a nitride film 16 is formed in direct contact with polycrystalline silicon layer 13 and p-type semiconductor substrate 1. This structure can reduce the volume of a bird's beak, which may be formed on the end of the element formation region, from that may be formed in the first embodiment, while simplifying the process. In addition, similarly to the first embodiment, formation of a parasitic transistor on the element formation region due to an electric field from an upper interconnection layer can be effectively prevented.

In the method of forming the above element isolation structure, after formation of trench 10 through the same steps as in the first embodiment, nitride film 16 is formed by a CVD method, as shown in FIG. 16. Referring to FIG. 17, nitride film 8 and p-type semiconductor substrate 1 on the bottom surface of trench 10 are exposed by antitropic etching process of nitride film 16. As shown in FIG. 18, polycrystalline silicon layer 13 is deposited to a predetermined thickness by a CVD method. Preferably, the thickness of polycrystalline silicon layer 13 is approximately one and a half times larger than the opening width of trench 10. Thereafter, the same steps as in the first embodiment are carried out to form the element isolation structure shown in FIG. 15.

(Third embodiment)

Figure 19:
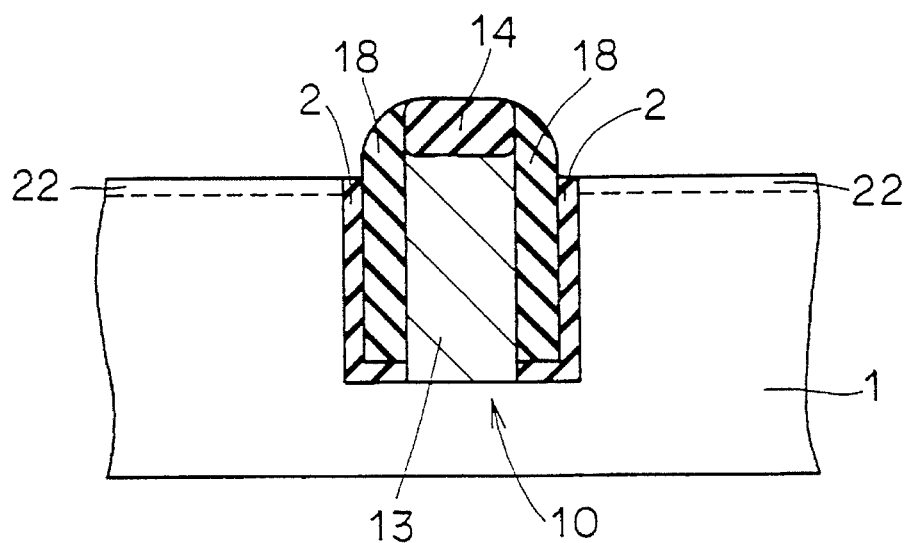
FIG. 19 is a cross sectional view showing an element isolation structure in accordance with a third embodiment of the present invention.

An element isolation structure in accordance with a third embodiment of the present invention will be described with reference to FIG. 19. FIG. 19 is a cross sectional view of an element isolation structure in accordance with a third embodiment of the present invention. Referring to FIG. 19, a nitride film 18 is formed in direct contact with polycrystalline silicon layer 13, and an oxide film 2 serving as a stress buffering film is formed between nitride film 18 and p-type semiconductor substrate 1. This structure does not require the oxide film formation step in the first embodiment, thereby simplifying the process. The same effects as in the second embodiment can be obtained in this embodiment.

Oxide film 2 may be formed between polycrystalline silicon layer 13 and nitride film 18, from which similar effect can be obtained.

Figure 45:
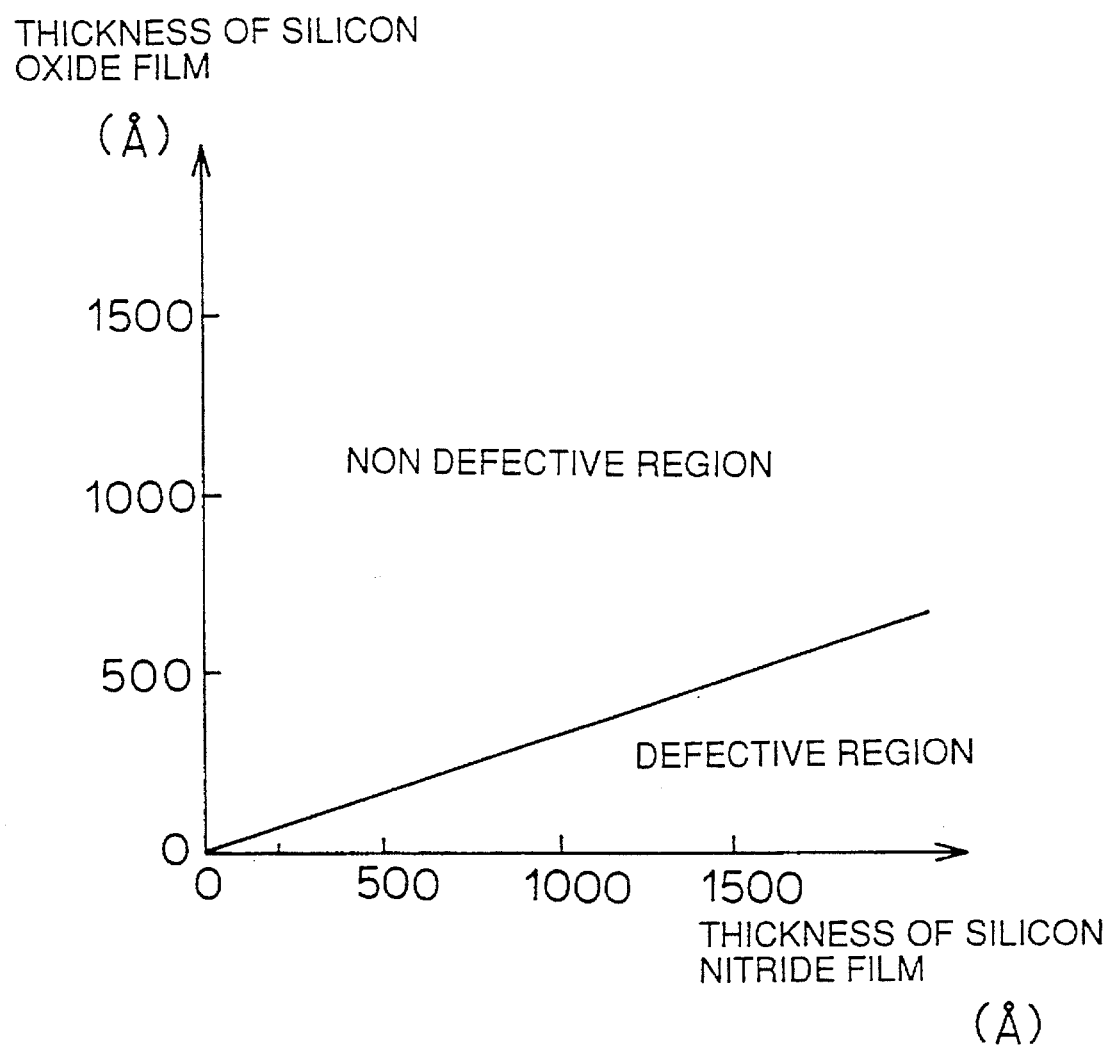
FIG. 45 is a graph showing the relation of the thicknesses of a silicon oxide film and a silicon nitride film and occurrence of a defective crystal on a silicon wafer.

With reference to FIG. 45, comparison will be made on the second embodiment in which nitride film 16 is in direct contact with the sidewall of trench 10 and the present embodiment in which oxide film 2 for buffering a stress is interposed. FIG. 45 is a graph disclosed in Appl. Phys. Lett. 33 (10), Nov. 15, 1978, showing the relation of occurrence of a defect on a silicon wafer and the thicknesses of a silicon oxide film and a silicon nitride film, in the case where thermal oxidation is performed after forming the silicon oxide film and the silicon nitride film in stack on the silicon wafer.

Referring to FIG. 45, in the case of the small thickness of the silicon oxide film, a defective crystal is observed on the wafer because of a stress. This results from thermal oxidation of the stacked structure of the silicon oxide film and the silicon nitride film. The above document, however, describes that even when the silicon nitride film is formed directly on the wafer, heat treatment alone cannot generate a stress enough to form a defect on the wafer.

In the present invention, the sidewall of trench 10 can hardly be oxidized even in the second embodiment because the upper end corner portion of the sidewall of the trench is surrounded with nitride films 8 and 16. Therefore, even if nitride film 16 is formed directly on the sidewall of the trench 10, a defective crystal can hardly be formed on the sidewall of trench 10. However, a stress may be generated to some degree by thermal oxidation. Such stress which may be generated between nitride film 16 and the sidewall of trench 10 can be relaxed by interposing oxide film 2 for buffering a stress as in the present embodiment. From the foregoing, it would be desirable to form a stress buffering film, such as an oxide film, between nitride film 16 and the sidewall of trench 10, as in the present embodiment.

Figure 20:
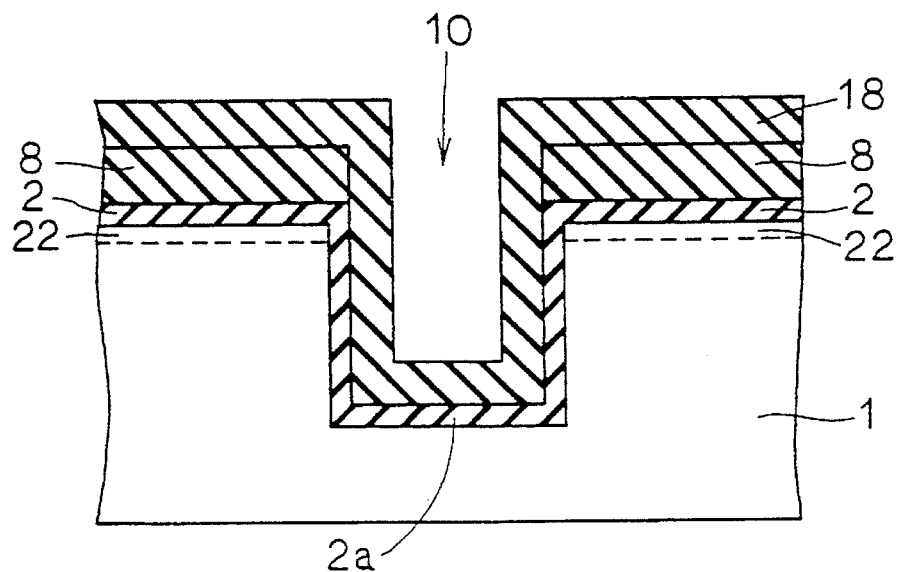
FIGS. 20 to 22 are cross sectional views showing the fifth to seventh steps of a process of forming the element isolation structure in accordance with the third embodiment of the present invention.
Figure 21:
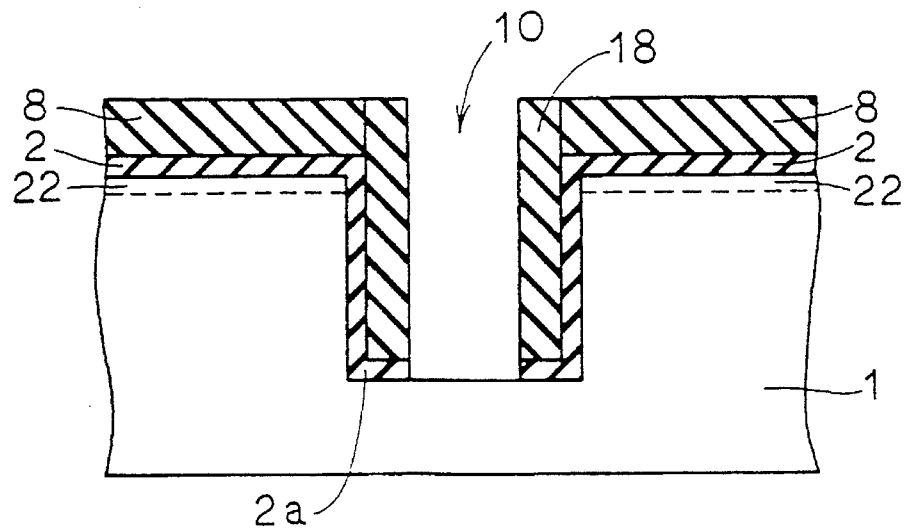
Figure 22:
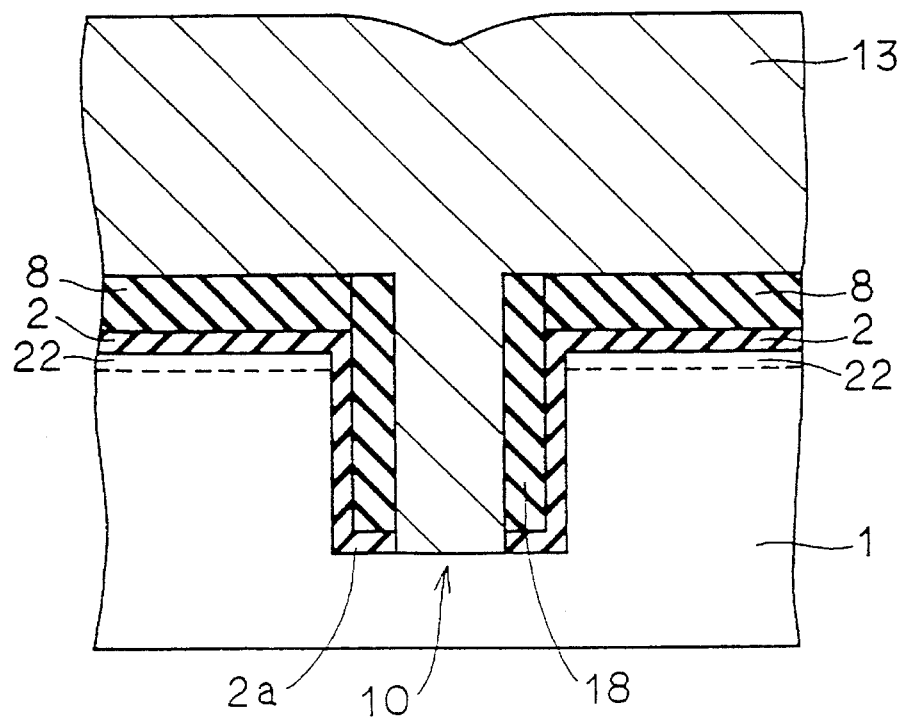

A method of forming the above element isolation structure will be described with reference to FIGS. 20 to 22. FIGS. 20 to 22 are cross sectional views showing the fifth to seventh steps of a process of forming the element isolation structure in this embodiment.

Referring to FIG. 20, after formation of trench 10 in the main surface of semiconductor substrate 1 through the same steps as in the first embodiment, an oxide film 2a is formed on the sidewall and the bottom surface of trench 10. Nitride film 18 is formed on the whole surface of p-type semiconductor substrate 1 by a CVD method. Referring to FIG. 21, nitride film 8 and p-type semiconductor substrate 1 at the bottom surface of trench 10 are exposed by anisotropic etching process of nitride film 18. As a result, nitride film 18 is left along the sidewall of trench 10. As shown in FIG. 22, polycrystalline silicon layer 13 is formed up to a predetermined thickness on the internal surface of trench 10 and nitride film 8. Thereafter, the same steps as in the first embodiment are carried out to form the element isolation structure.

(Fourth embodiment)

Figure 26:
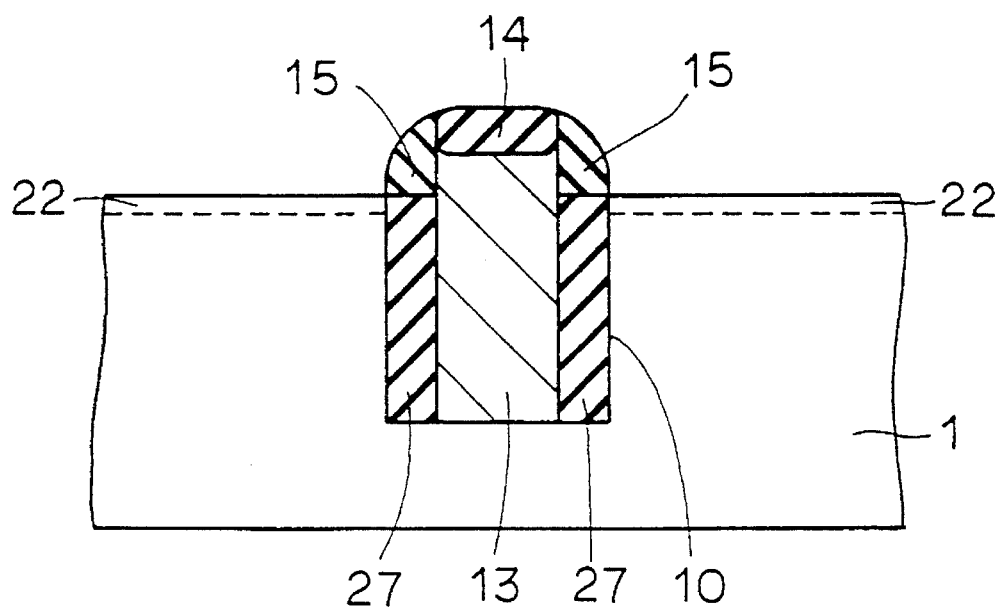
FIG. 26 is a cross sectional view of an element isolation structure in accordance with a fourth embodiment of the present invention.

A fourth embodiment of the present invention will now be described with reference to FIGS. 26 to 38. FIG. 26 is a cross sectional view of an element isolation structure in accordance with the fourth embodiment of the present invention. Referring to FIG. 26, an insulating layer 27 made of a silicon oxide film or the like is formed between the sidewall 10a of trench 10 and conductive layer 13. A nitride film 15 is formed on insulating layer 27. Nitride film 15 is provided only on the region between the upper corner portion of the sidewall 10a of trench 10 and field oxide film 14. Also in this structure, the same effects can be obtained as in the first to third embodiments. Nitride film 15 may be another dielectric film of higher dielectric constant than that of a silicon oxide film.

Referring to FIGS. 27 to 37, description will now be made on the method of forming the element isolation structure in the fourth embodiment. FIGS. 27 to 37 are cross sectional views showing the third to thirteenth steps of the process of forming the element isolation structure in this embodiment.

Figure 27:
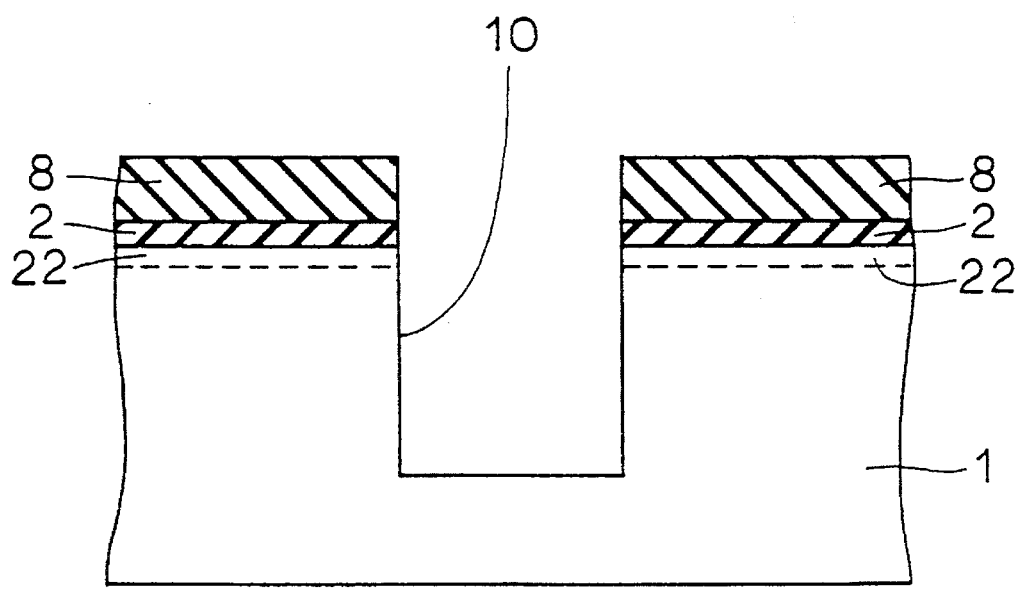
FIGS. 27 to 37 are cross sectional views showing the third to fourteenth steps of a process of forming the element isolation structure in accordance with the fourth embodiment of the present invention.
Figure 28:
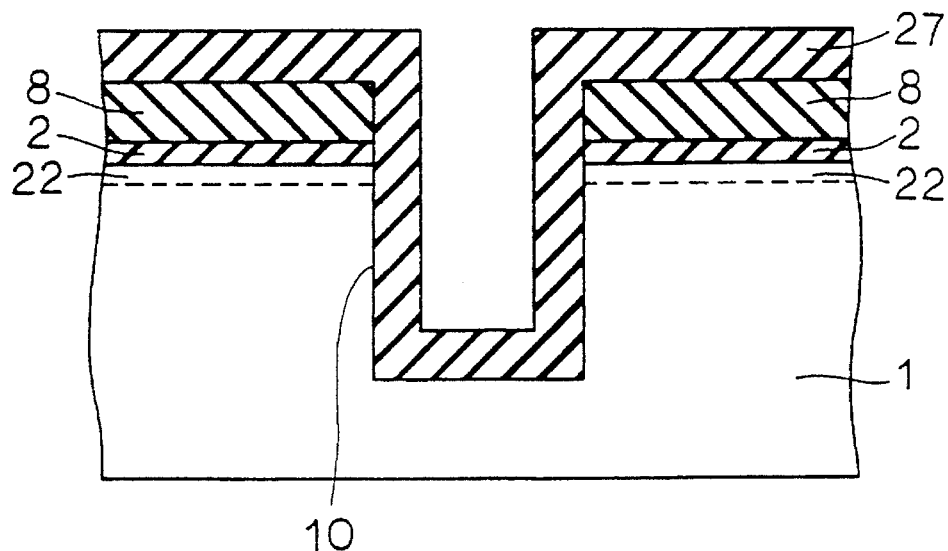

Referring to FIG. 27, trench 10 is formed through the same steps as in the first embodiment. Referring to FIG. 28, insulating layer 27 made of a silicon oxide film or the like is formed all over the main surface of p-type semiconductor substrate 1 by a CVD method or the like.

Figure 29:
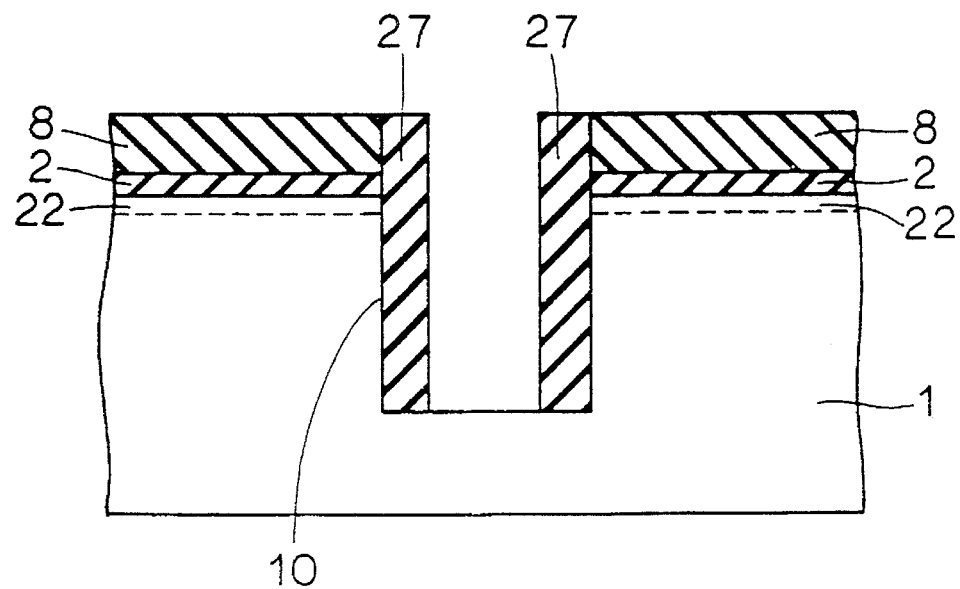
Figure 30:
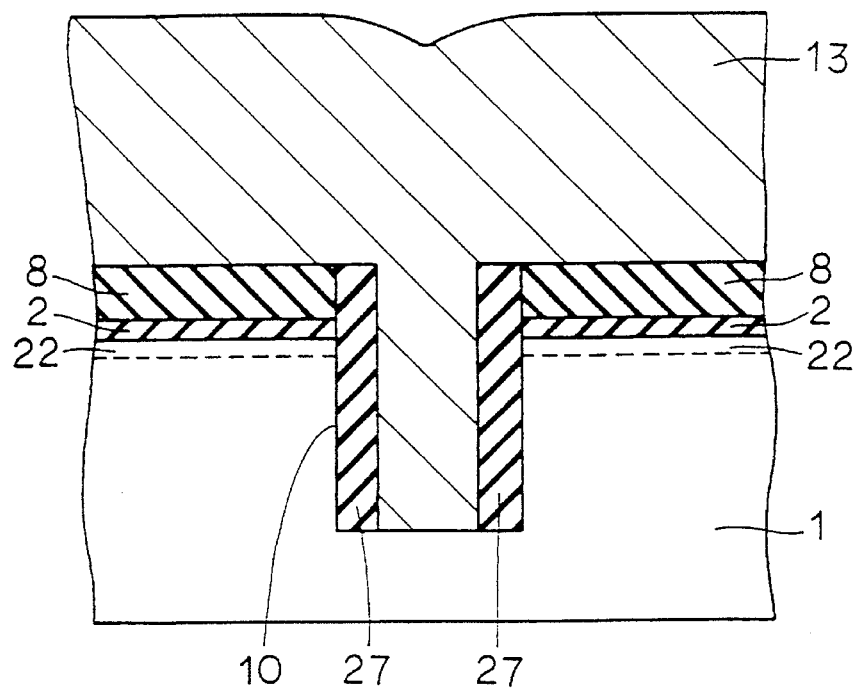

Referring to FIG. 29, insulating layer 27 is subjected to anisotropical etching, so as to be left only on the sidewall of trench 10. Referring to FIG. 30, polycrystalline silicon layer 13 is deposited to fill trench 10 with the same method as in the first embodiment.

Figure 31:
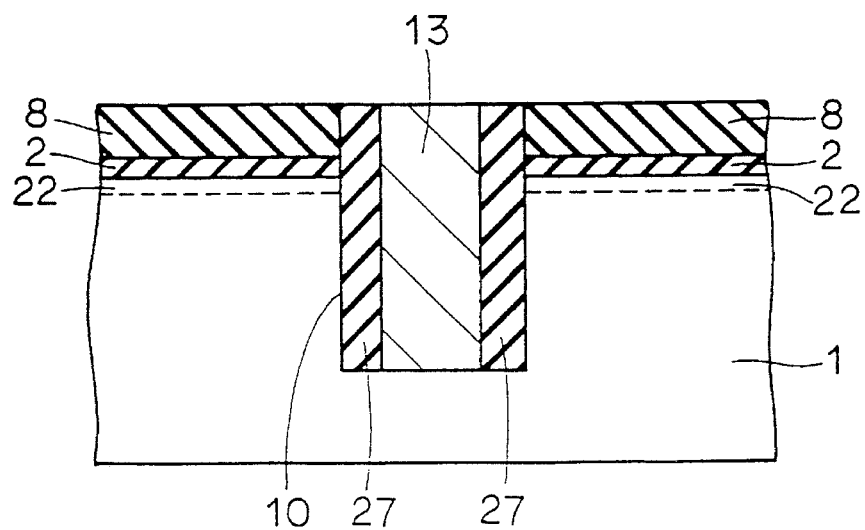

Referring to FIG. 31, polycrystalline silicon layer 13 is etched back, so that the upper surface of dielectric film 8 and insulating layer 27 is exposed. At this time, the upper surface of insulating layer 27 and nitride film 8 and that of polycrystalline silicon layer 13 are substantially coplanar.

Figure 32:
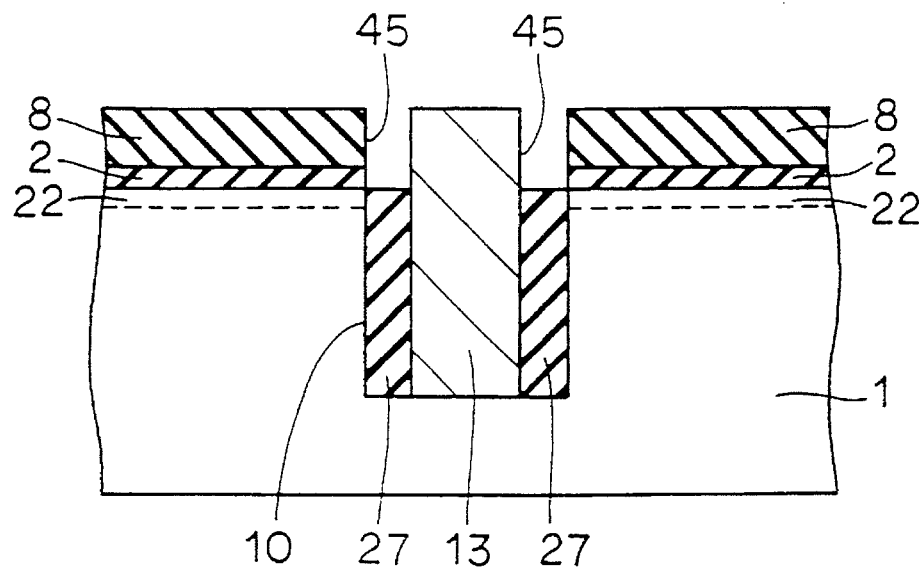

Referring to FIG. 32, insulating layer 27 is subjected to wet etching, so that the upper surface of insulating layer 27 is lowered. As a result, a concave portion 45 is formed on insulating layer 27. At this time, it is preferable to lower the upper surface of insulating layer 27 substantially at the same height as the main surface of p-type semiconductor substrate 1.

Figure 33:
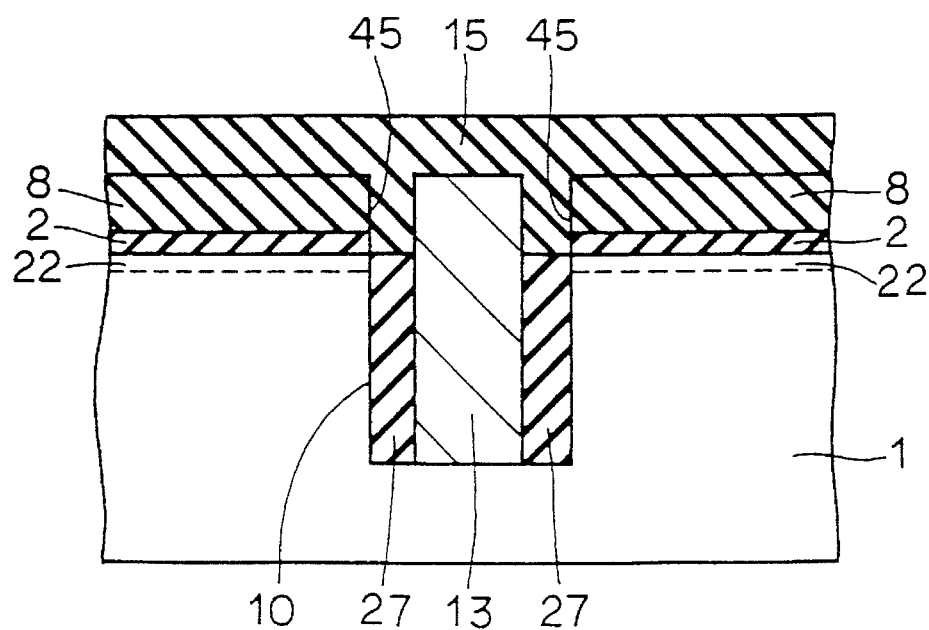
Figure 34:
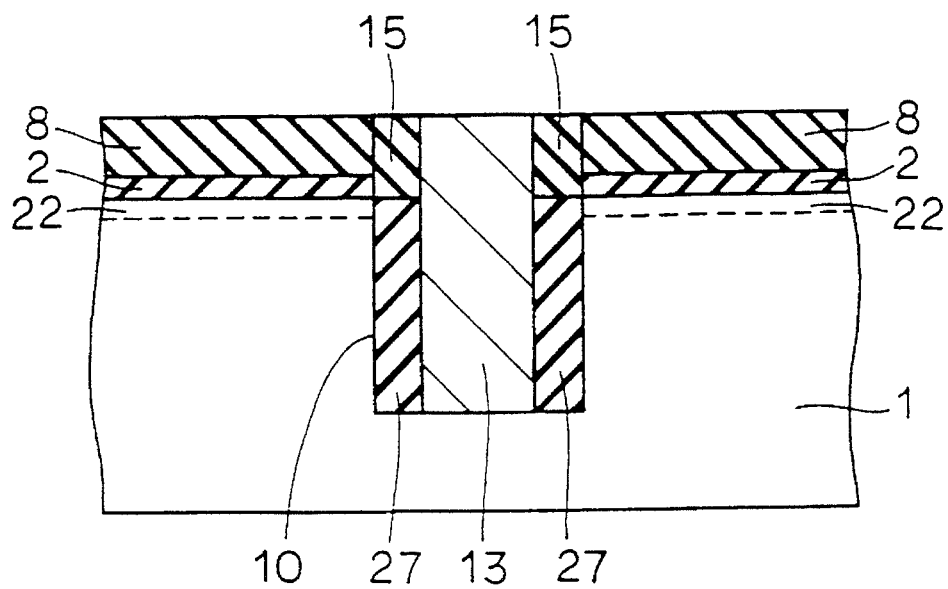

Referring to FIG. 33, nitride film 15 is formed all over the main surface of p-type semiconductor substrate 1 so as to fill concave portion 45 by a CVD method. Referring to FIG. 34, nitride film 15 is etched back, so that the upper surface of polycrystalline silicon layer 13 is exposed, and nitride film 15 is left only on the upper surface of insulating layer 27.

Figure 35:
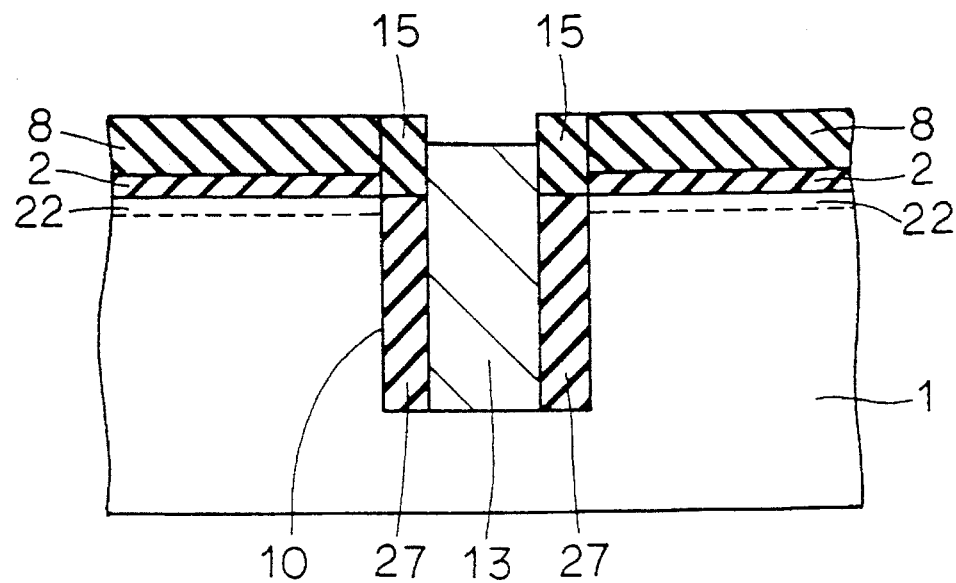

Referring to FIG. 35, polycrystalline silicon layer 13 is subjected to etching, so that the upper surface thereof is lowered.

Figure 36:
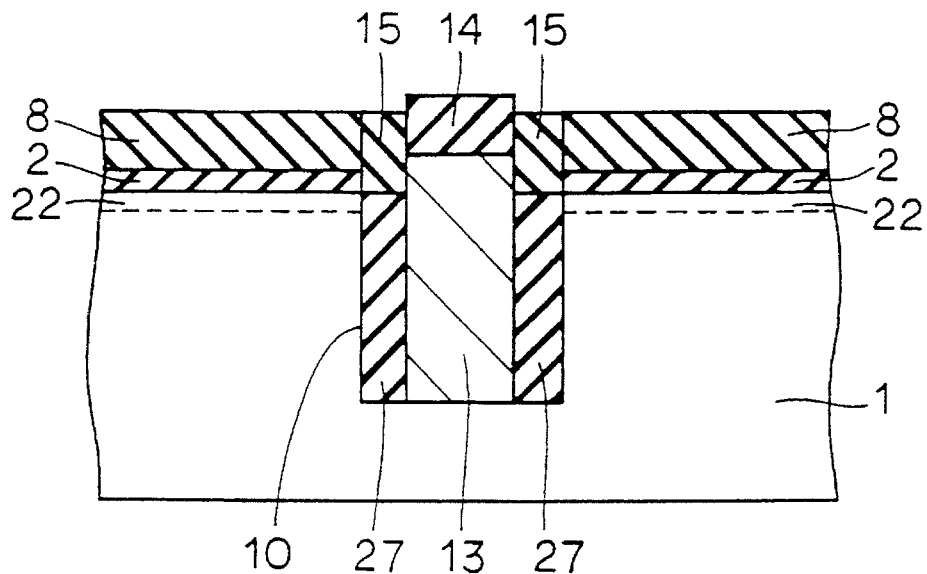

Referring to FIG. 36, the upper surface of polycrystalline silicon layer 13 is subjected to thermal oxidation with nitride films 8 and 15 as a mask, so that field oxide film 14 is formed on polycrystalline silicon layer 13.

Figure 37:
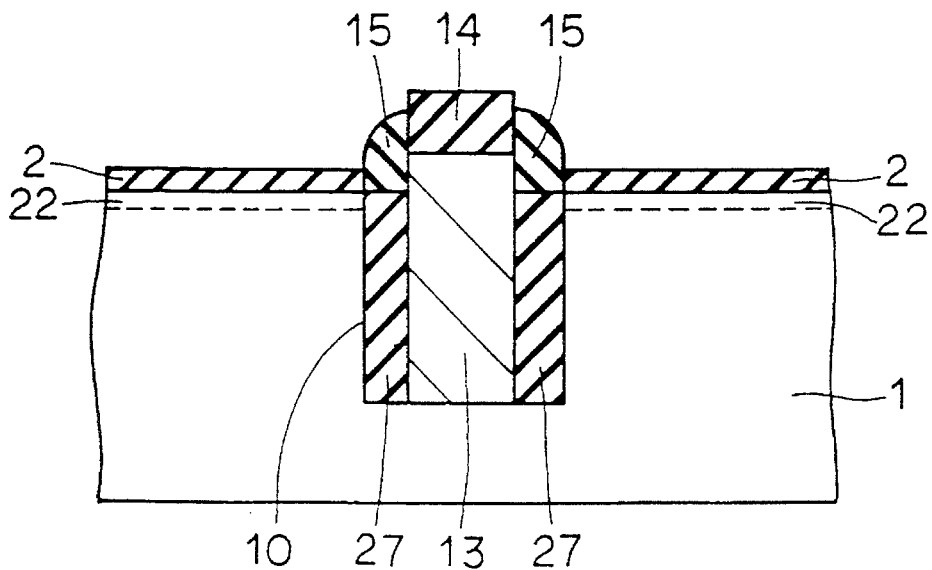

Referring to FIG. 37, nitride films 8 and 15 are subjected to anisotropical etching, so that the surface of oxide film 2 is exposed. Consequently, nitride film 15 is formed extending from the sidewall of field oxide film 14 to the upper end corner portion of trench 10. Subsequently, field oxide film 14 and oxide film 2 are subjected to wet etching, whereby the element isolation structure shown in FIG. 26 is obtained.

Figure 38:
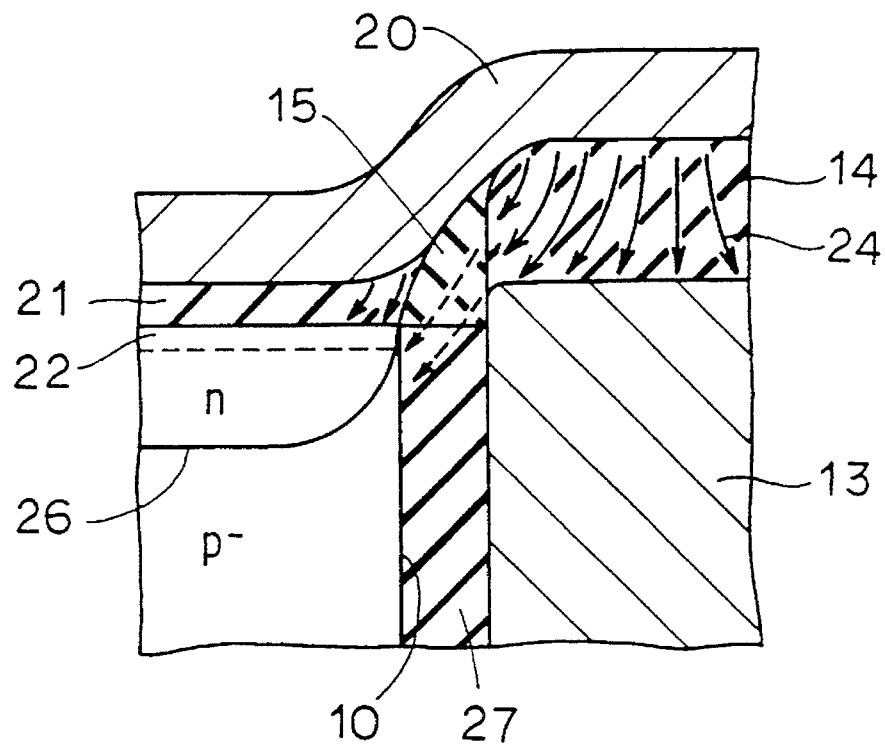
FIG. 38 is an enlarged partial cross sectional view showing the MOS transistor employing the element isolation structure in accordance with the fourth embodiment of the present invention.

FIG. 38 is a partial cross sectional view of the MOS transistor employing the element isolation structure of the present embodiment. Referring to FIG. 38, in the element isolation structure of the present embodiment, nitride film 15 is formed only between the upper end corner portion of the sidewall of trench 10 and gate electrode 20. Also in this case, an electric field applied from gate electrode 20 to the upper end corner portion of trench 10 can be weakened by nitride film 15 and polycrystalline silicon layer 13, as in the first embodiment. Accordingly, only the electric field weakened by nitride film 15 or polycrystalline silicon layer 13 is applied on the upper end corner portion of the sidewall of trench 10, so that formation of an inverted layer at the upper end corner portion of the sidewall of trench 10 is effectively prevented.

Additionally, as shown in FIG. 38, the upper surface of polycrystalline silicon layer 13 which is not lower than the main surface of p-type semiconductor substrate 1 ensures that the electric field 24 from gate electrode 20 should be weakened by nitride film 15 and polycrystalline silicon layer 13. From the foregoing, the element isolation structure of high reliability can be obtained in this embodiment, as in the first to third embodiments.

(Fifth embodiment)

Figure 39:
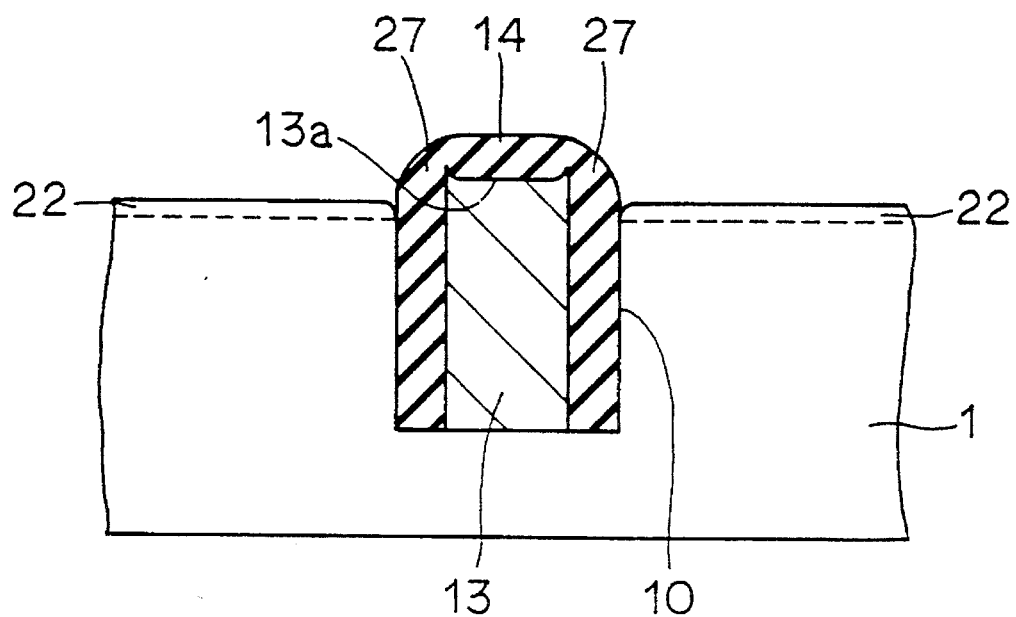
FIG. 39 is a cross sectional view of an element isolation structure in accordance with a fifth embodiment of the present invention.

A fifth embodiment of the present invention will be described with reference to FIGS. 39 to 44. FIG. 39 is a cross sectional view of an element isolation structure in accordance with a fifth embodiment of the present invention. FIG. 44 is an enlarged partial cross sectional view of the MOS transistor employing the element isolation structure of this embodiment. Referring to FIGS. 39 and 44, a dielectric film having a high dielectric constant is not formed, unlike other embodiments described above. In this embodiment, however, the upper surface 13a of conductive layer (polycrystalline silicon layer) 13 is formed not lower than the main surface of the semiconductor substrate, i.e. the surface of an n-type impurity region 26 in this case.

Accordingly, an electric field applied from gate electrode 20 located on field oxide film 14 can be shielded by conductive layer 13. Also, the distance between gate electrode 20 located on field oxide film 14 and the upper end corner portion of the sidewall of trench 10 can be made larger than that in the conventional structure. Consequently, an electric field applied from gate electrode 20 to the upper end corner portion of the sidewall of trench 10 can be weakened by field oxide film 14, which leads to reduction in the possibility of formation of a parasitic transistor.

A method of forming the element isolation structure of the fifth embodiment will now be described with reference to FIGS. 40 to 43. FIGS. 40 to 43 are cross sectional views showing the third to sixth steps of the process of forming the element isolation structure of the present embodiment.

Figure 40:
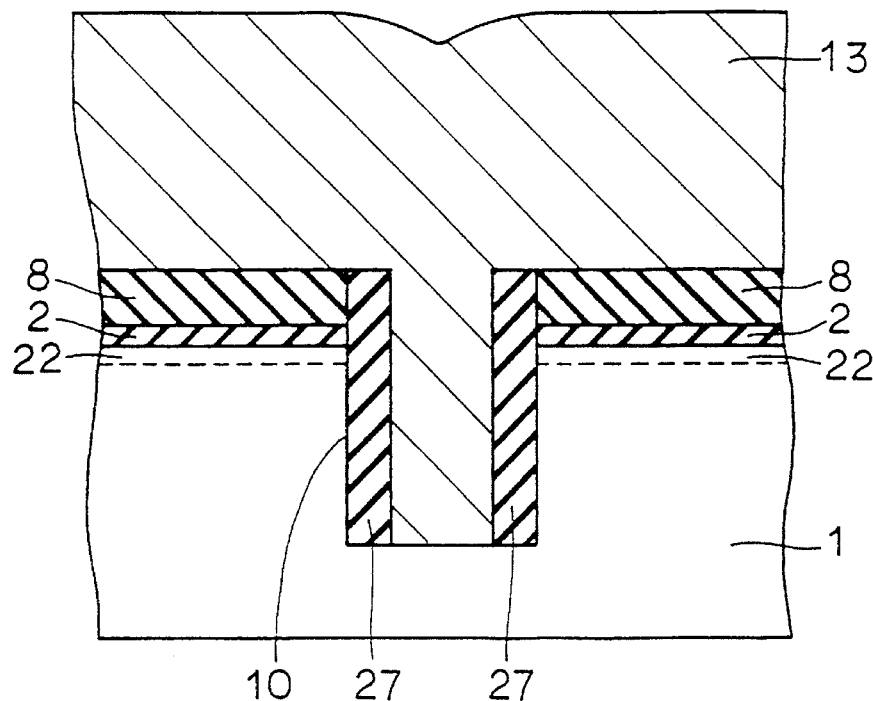
FIGS. 40 to 43 are cross sectional views showing the third to sixth steps of a process of forming the element isolation structure in accordance with the fifth embodiment of the present invention.

Referring to FIG. 40, trench 10 is formed through the same steps as in the first embodiment. Subsequently, an insulating layer 27 and polycrystalline silicon layer 13 are formed through the same steps as in the fourth embodiment.

Figure 41:
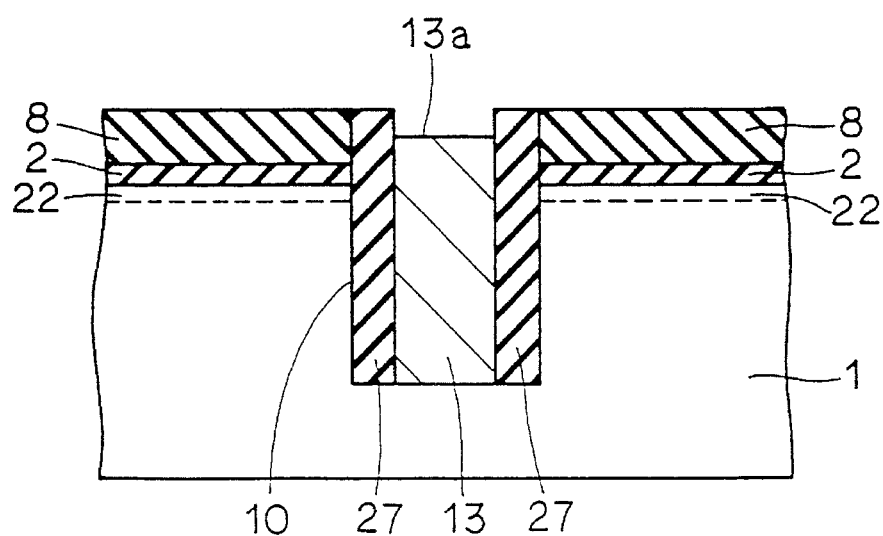
Figure 42:
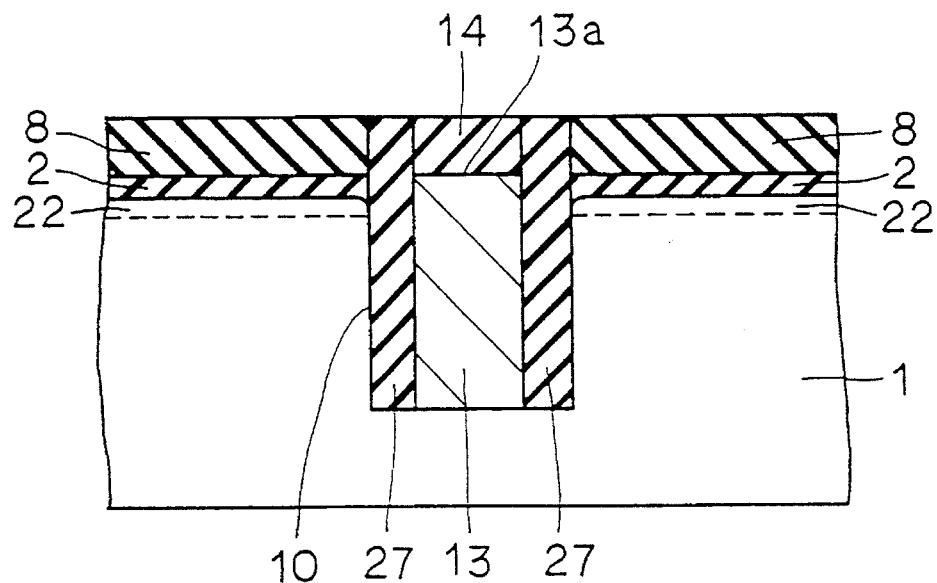

Referring to FIG. 41, polycrystalline silicon layer 13 is etched back, so that an upper surface 13a of polycrystalline silicon layer 13 is lowered. Referring to FIG. 42, upper surface 13a of polycrystalline silicon layer 13 is subjected to thermal oxidation with nitride film 8 as a mask, to form field oxide film 14 on polycrystalline silicon layer 13. At this time, conditions for the thermal oxidation are appropriately adjusted so that the lower surface of field oxide film 14, i.e. upper surface of 13a of polycrystalline silicon layer 13, is made not lower than the main surface of p-type semiconductor substrate 1.

Figure 43:
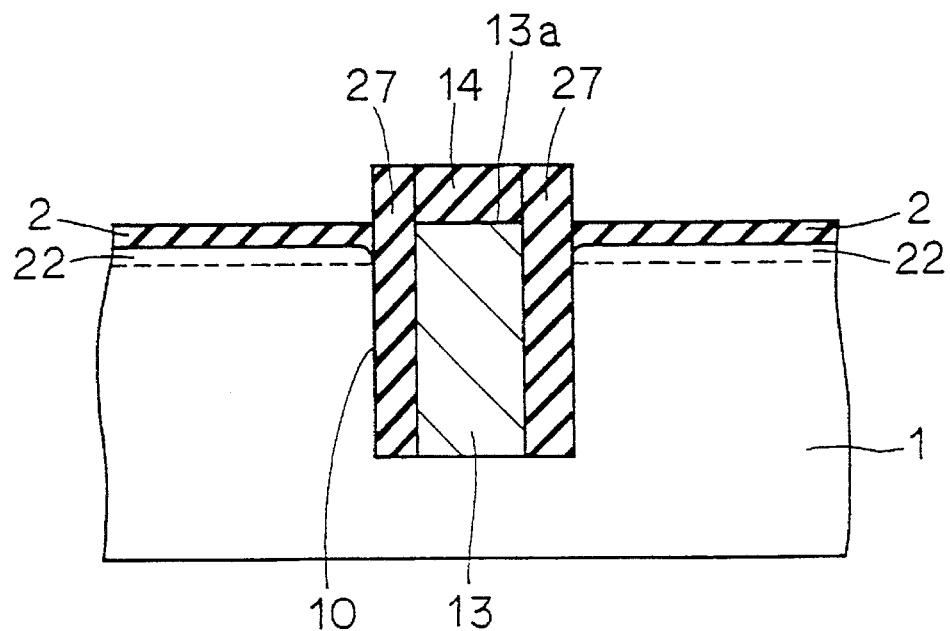
Figure 44:
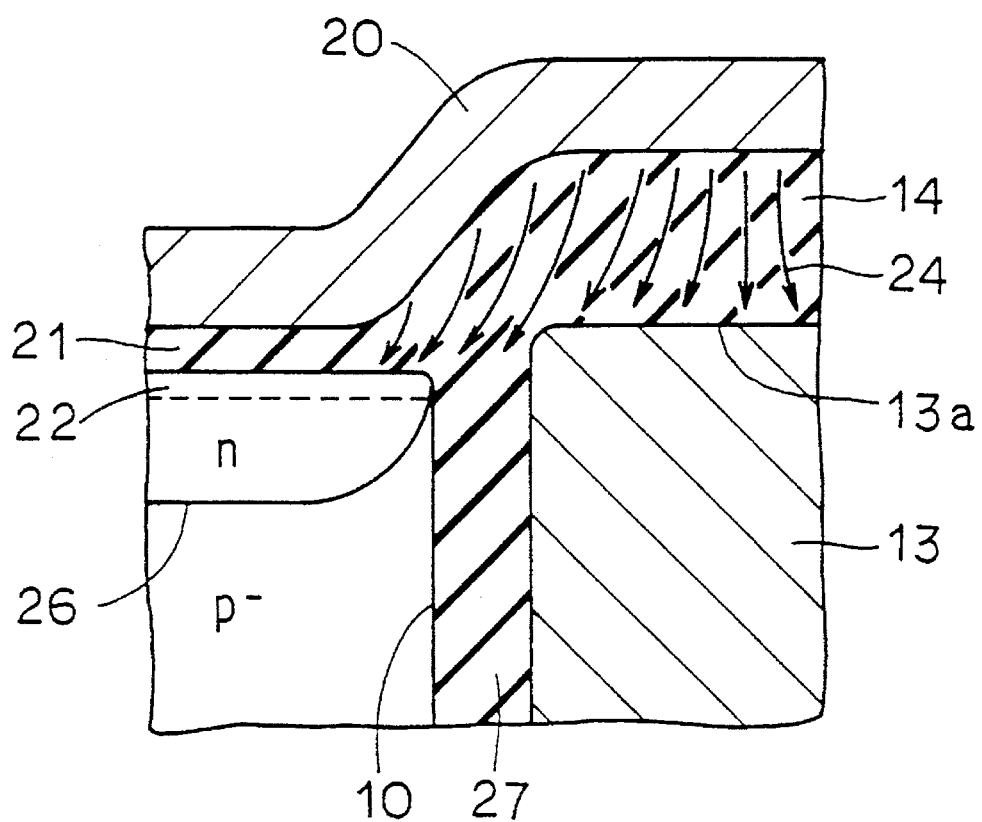
FIG. 44 is an enlarged partial cross sectional view showing the MOS transistor employing the element isolation structure in accordance with the fifth embodiment of the present invention.

Referring to FIG. 43, nitride film 8 is subjected to wet etching to be removed. Thereafter, oxide film 2, insulating layer 27 and field oxide film 14 are subjected to wet etching, so that the main surface of p-type semiconductor substrate 1 is exposed. Through the above steps, the element isolation structure of the present embodiment shown in FIG. 39 is formed. Subsequently, insulating layer 21, gate electrode 20, impurity region 26 and the like are formed to complete the MOS transistor shown in FIG. 44.

Figure 46:
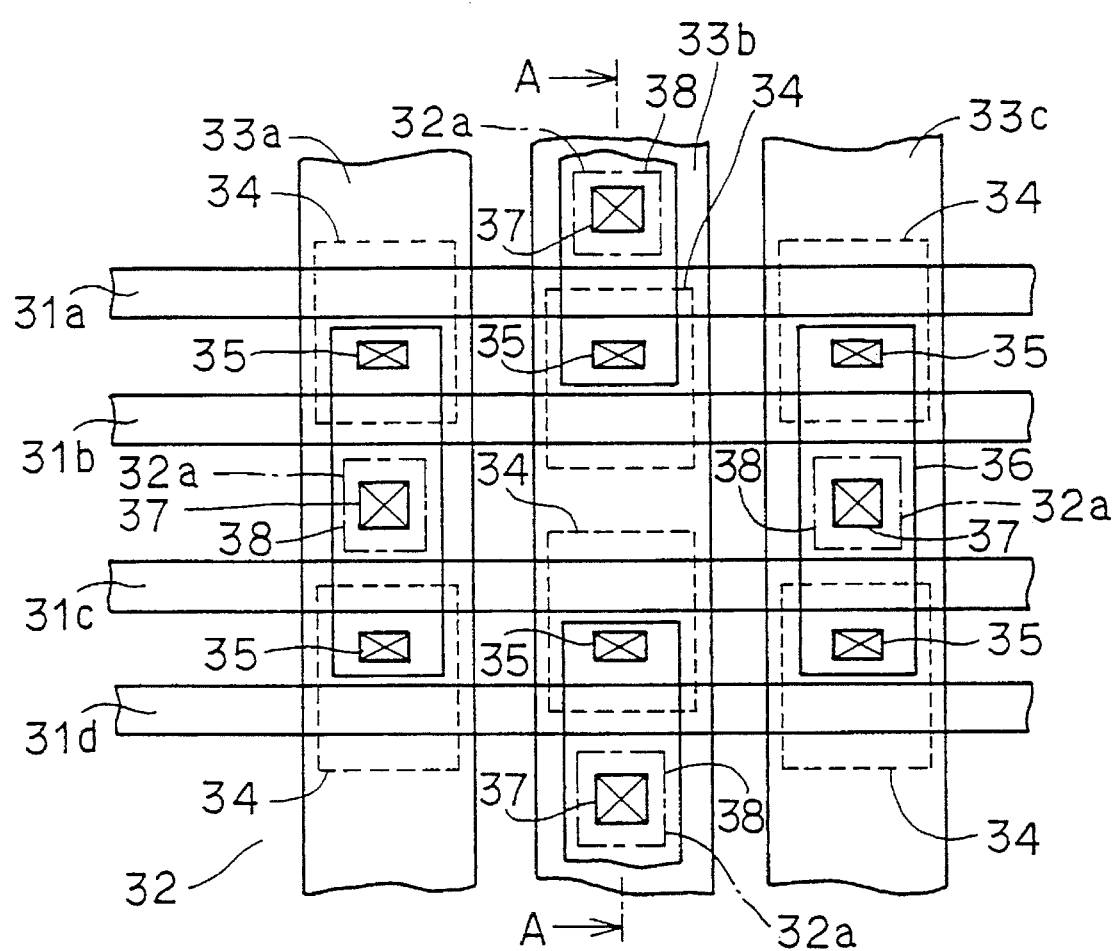
FIG. 46 is a plan view of a DRAM employing the element isolation structure in accordance with the first embodiment of the present invention.
Figure 47:
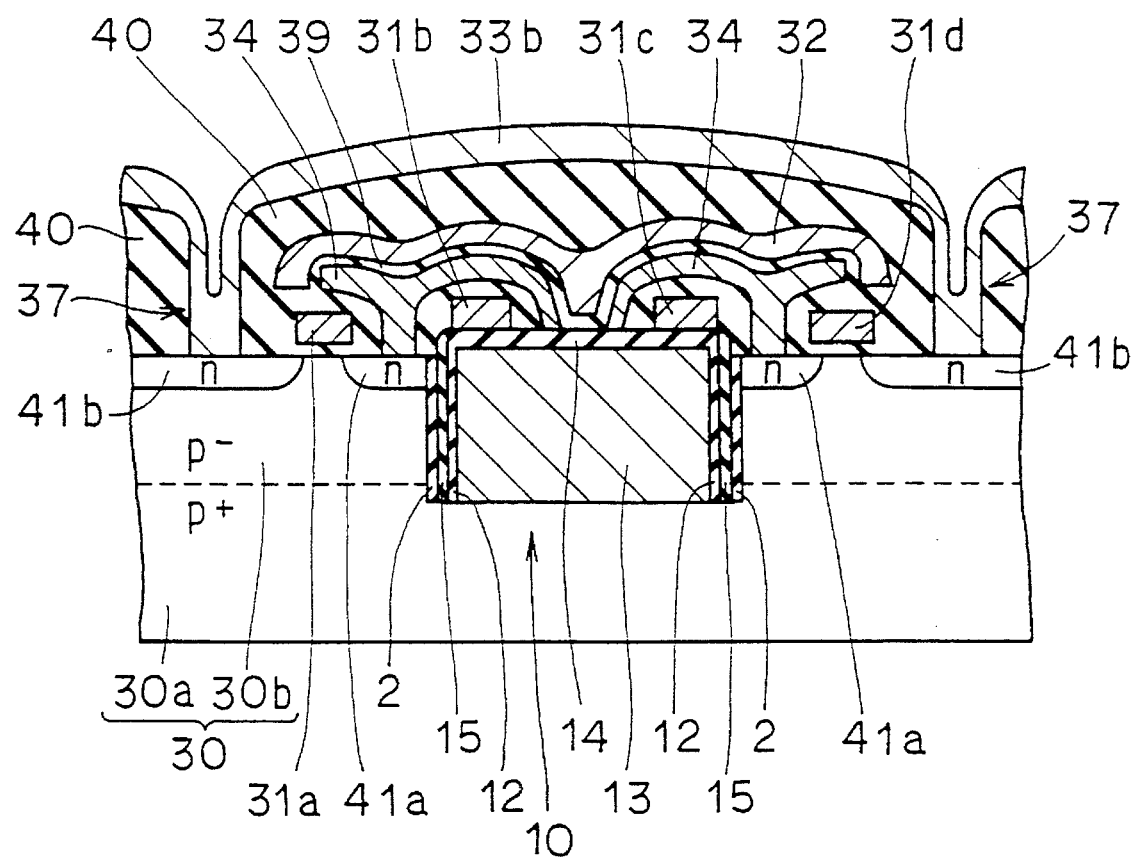
FIG. 47 is a cross sectional view taken along the line A—A in FIG. 46.
Figure 48:
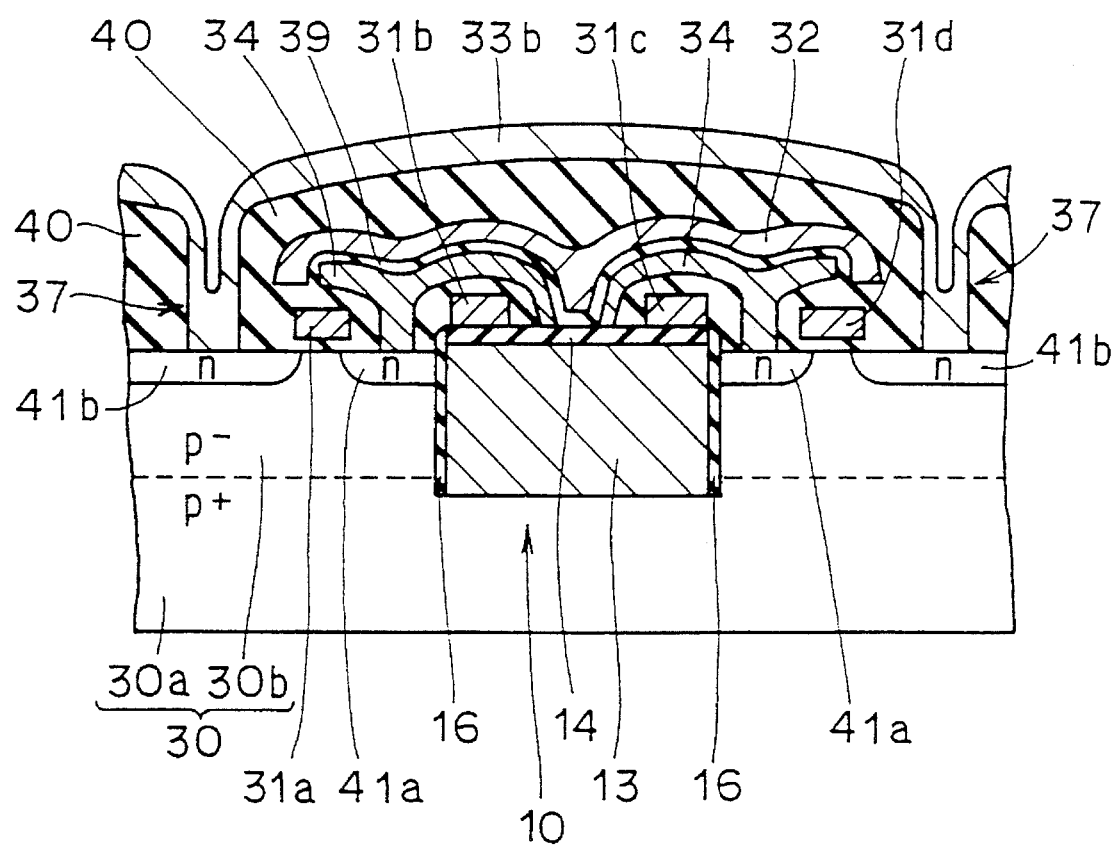
FIG. 48 is a cross sectional view of a DRAM employing the element isolation structure in accordance with the second embodiment of the present invention.
Figure 49:
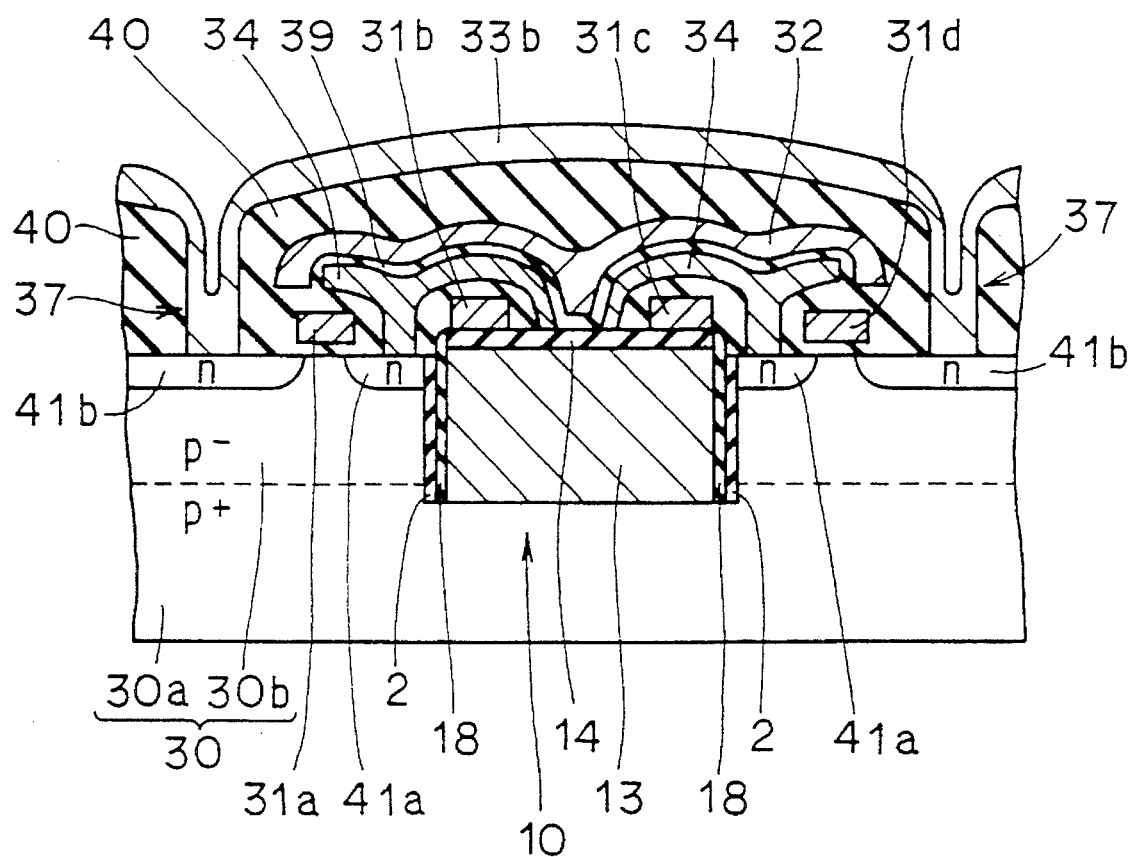
FIG. 49 is a cross sectional view of a DRAM employing the element isolation structure in accordance with the third embodiment of the present invention.
Figure 50:
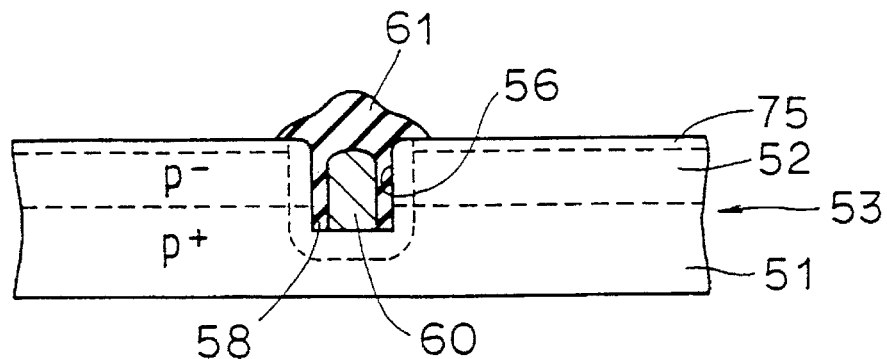
FIG. 50 is a cross sectional view showing one example of a conventional element isolation structure.
Figure 51:
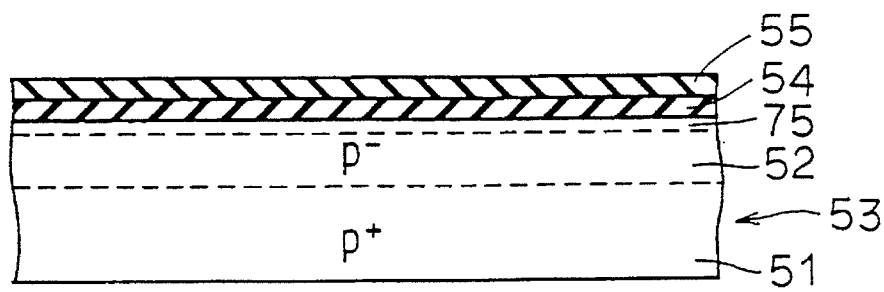
FIGS. 51 to 57 are cross sectional views showing the first to seventh steps of a process of forming the conventional element isolation structure.
Figure 52:
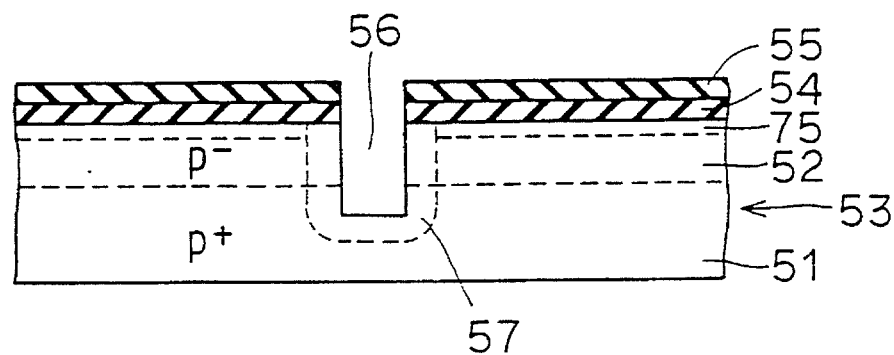
Figure 53:
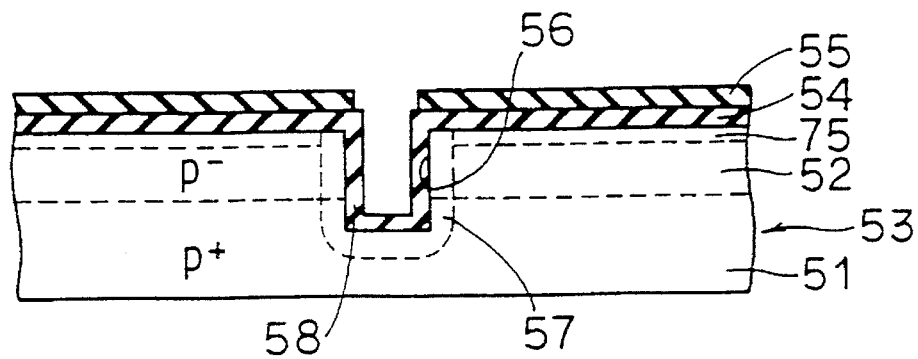
Figure 54:
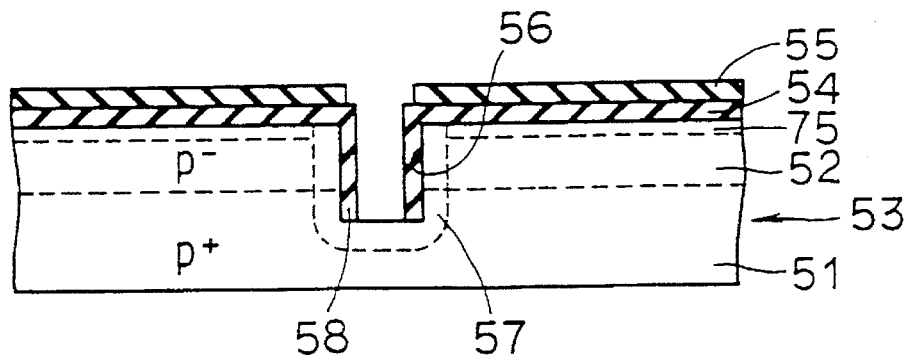
Figure 55:
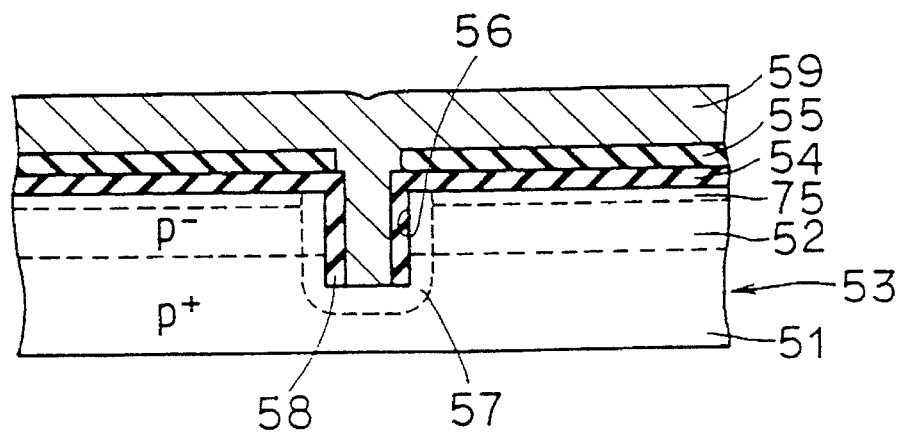
Figure 56:
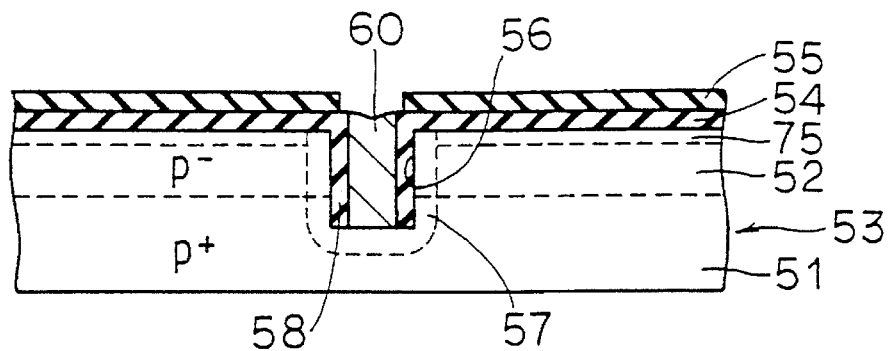
Figure 57:
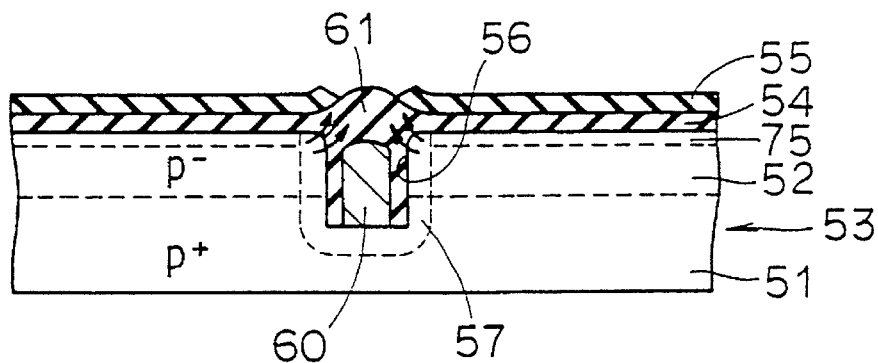
Figure 58:
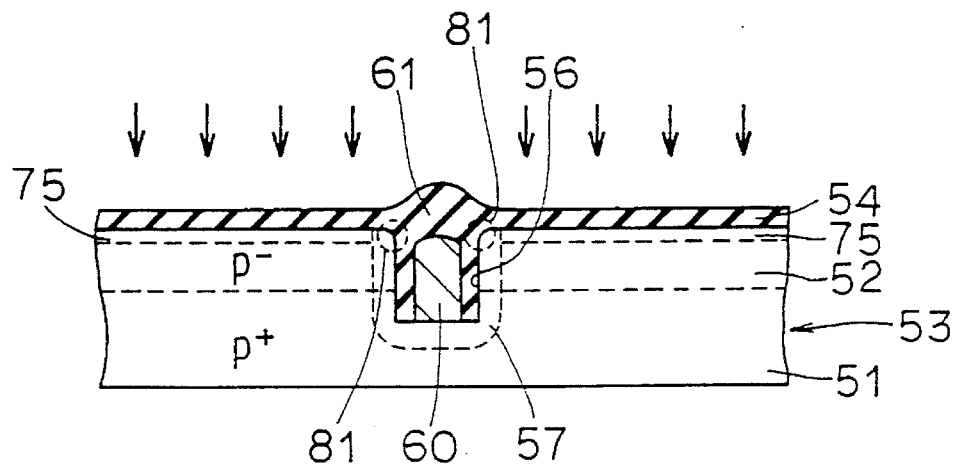
FIG. 58 is a cross sectional view showing a modification of the step of forming an impurity layer for channel doping in the process of forming the conventional element isolation structure.

Application of the present invention to a DRAM will be described with reference to FIGS. 46 to 49. FIG. 46 is a plan view of a DRAM employing the element isolation structure in accordance with the first embodiment of the present invention. FIG. 47 is a cross sectional view taken along the line A—A in FIG. 46. FIG. 48 is a cross sectional view of a DRAM employing the element isolation structure in accordance with the second embodiment of the present invention. FIG. 49 is a cross sectional view of a DRAM employing the element isolation structure in accordance with the third embodiment of the present invention.

Referring to FIG. 46, a plurality of word lines 31*a*, 31*b*, 31*c*, and 31*d* are formed in a low direction. Bit lines 33*a*, 33*b*, and 33*c* are formed to cross word lines 31*a*, 31*b*, 31*c*, and 31*d* at right angles. Each of element formation regions 36 is formed on a predetermined region under each bit line. A trench for element isolation is formed between element formation regions 36.

A storage node 34 is formed extending on a predetermined region of element formation region 36, and the element isolation region. A contact portion 35 is formed on storage node 34, in connection with a predetermined impurity region formed on the main surface of the semiconductor substrate.

A cell plate 32 is formed on storage node 34 with an insulating film interposed therebetween. Cell plate 32 is a continuous integral plate with hole portions 32*a* provided at contact portions 37 of respective bit lines 33*a*, 33*b* and 33*c* and predetermined impurity regions. Bit lines 33*a*, 33*b* and 33*c* are formed on cell plate 32 with an interlayer insulating film interposed therebetween. Bit lines 33*a*, 33*b* and 33*c* are respectively connected to the predetermined impurity regions formed on the semiconductor substrate through contact portions 37.

Referring to FIG. 47, a p-type semiconductor substrate 30 includes a p-type high concentration impurity layer 30*a* and a p-type low concentration impurity layer 30*b*. n-type impurity regions 41*a* and 41*b* are formed in the main surface of p-type semiconductor substrate 30. In this case, the element isolation structure of the present invention is to be formed on the region located under word lines 31*b* and 31*c*.

Storage node 34 is formed on a predetermined region over word lines 31*a*, 31*b*, 31*c* and 31*d*, electrically connected to an impurity region 41*a*. Cell plate 32 is formed on storage node 34 with an insulating film 39 interposed therebetween. Bit line 33*b* is formed on cell plate 32 with an interlayer insulating film 40 interposed therebetween. Bit line 33*b* is electrically connected to an impurity region 41*b* through contact portion 37.

Application of the element isolation structure in accordance with the second and third embodiments of the present invention to a DRAM will be described with reference to FIGS. 48 and 49. Referring to FIG. 48, nitride film 16 is formed in direct contact with the sidewalls of conductive layer 13 and trench 10. The other structure is the same as that shown in FIG. 47.

Referring to FIG. 49, nitride film 18 is formed in direct contact with conductive layer 13. Nitride film 18 is formed on the sidewall of trench 10 with oxide film 2 interposed therebetween. The other structure is the same as that of the DRAM shown in FIG. 47. Approximately the same effects as in FIG. 47 can be obtained in the structure shown in FIGS. 48 and 49.

In the above element isolation structure, existence of nitride films 15, 16 and 18 on the sidewall of trench 10 can effectively prevent formation of a parasitic transistor on the element formation region. Specifically, a semiconductor device having an element isolation structure of superior isolation capability and high reliability can be obtained. The element isolation structure in accordance with the present invention can be employed also in devices other than a DRAM.

As described above, in the semiconductor device having the trench isolation structure according to the one aspect of the present invention, an electric field applied from the conductive layer to the upper end corner portion of the sidewall of the trench can be weakened by the second insulating layer, whereby formation of an inverted layer at the upper end corner portion of the sidewall of the trench as in the conventional structure, that is, formation of a parasitic transistor, can be effectively prevented. Consequently, an element isolation structure of high reliability can be obtained.

In the semiconductor device having the trench isolation structure according to the another aspect of the present invention, the upper surface of the first conductive layer is not lower than the main surface of the semiconductor substrate whereby the possibility of formation of an inverted layer at the upper end corner portion of the sidewall of the trench can be reduced compared to the conventional structure. Consequently, also in this aspect, an element isolation structure of high reliability can be obtained.

According to the method of manufacturing the semiconductor device having the trench isolation structure of the present invention, considerable reduction in the concentration at the upper end corner portion of the sidewall of the trench, and oxidization of the upper end corner portion of the sidewall of the trench can be effectively prevented. Additionally, the upper surface of the first conductive layer can be made not lower than the main surface of the semiconductor substrate. From the foregoing, a semiconductor device having a trench isolation structure of high reliability in which an inverted layer cannot be easily formed at an upper end corner portion of a sidewall of a trench can be formed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a trench isolation structure, comprising:

a semiconductor substrate having a main surface;

a trench for element isolation, formed in the main surface of said semiconductor substrate;

a first insulating layer formed over said trench;

a conductive layer formed on said first insulating layer and extending above said main surface; and a second insulating layer formed over said trench so as to extend from said conductive layer to an upper end corner portion of a sidewall of said trench with an increasingly downwardly sloping surface, and having a higher relative dielectric constant than that of said first insulating layer.

2. The semiconductor device having the trench isolation structure according to claim 1, wherein a second conductive layer is formed beneath said first insulating layer, electrically connected to said semiconductor substrate at a bottom of said trench, and spaced from the sidewall of said trench by a predetermined distance, and said second insulating layer extends to a region between said second conductive layer and the sidewall of said trench.

3. The semiconductor device having the trench isolation structure according to claim 2, wherein a stress buffering film is formed at least one of a region between said second insulating layer and the sidewall of said trench, and a region between said second conductive layer and said second insulating layer.

4. The semiconductor device having the trench isolation structure according to claim 3, wherein said stress buffering film is a silicon oxide film.

5. The semiconductor device having the trench isolation structure according to claim 1, wherein a second conductive layer is formed beneath said first insulating layer, electrically connected to said semiconductor substrate at a bottom of said trench, and spaced from the sidewall of said trench by a predetermined distance, and a third insulating layer of material different from that of said second insulating layer is formed between said second conductive layer and the sidewall of said trench.

6. The semiconductor device having the trench isolation structure according to claim 5, wherein said third insulating layer is a silicon oxide film.

7. The semiconductor device having the trench isolation structure according to claim 5, wherein an upper surface of said second conductive layer is not lower than the main surface of said semiconductor substrate.

8. The semiconductor device having the trench isolation structure according to claim 1, wherein said first insulating layer is a silicon oxide film, and said second insulating layer is made of at least one material selected from the group consisting of a silicon nitride film ($Si_3N_4$), tantalum oxide ($Ta_2O_5$), and PZT.

9. A semiconductor device having a trench isolation structure, comprising:

a semiconductor substrate of a first conductivity type having a main surface;

a trench for element isolation, formed to surround a predetermined region of the main surface of said semiconductor substrate;

a first conductive layer formed electrically connected to said semiconductor substrate at a bottom of said trench extending above said main surface, and spaced from a sidewall of said trench by a predetermined distance;

a first insulating layer formed on said first conductive layer;

a second conductive layer formed on first insulating layer extending onto the predetermined region of the main surface of said semiconductor substrate;

a second insulating layer formed over said trench so as to extend at least from said second conductive layer to a level of an upper end corner portion of the sidewall of said trench with an increasingly downwardly sloping surface, and having a higher relative dielectric constant than that of said first insulating layer;

a channel region formed in the main surface of said semiconductor substrate beneath said second conductive layer; and a pair of impurity regions of a second conductivity type formed on the main surface of said semiconductor substrate so as to sandwich said channel region;

wherein a channel-doped region is formed in the surface of said channel region, and said channel-doped region has a flat upper surface.

10. A semiconductor device having a trench isolation structure, comprising:

a semiconductor substrate of a first conductivity type having a main surface;

a trench for element isolation, formed in the main surface of said semiconductor substrate;

a conductive layer formed electrically connected to said semiconductor substrate at a bottom of said trench and extending above said main surface, and spaced from a sidewall of said trench by a predetermined distance;

a first insulating layer formed on said conductive layer;

a word line formed on said first insulating layer, extending onto the main surface of said semiconductor substrate;

a second insulating layer formed over the trench so as to extend from said word line at least to a level of an upper end corner portion of the sidewall of said trench with an increasingly downwardly sloping surface, and having a higher relative dielectric constant than that of said first insulating layer;

a pair of impurity regions of a second conductivity type formed spaced from each other so as to define a channel region on the main surface of said semiconductor substrate beneath said word line;

an interlayer insulating layer formed to cover said word line, and having an opening on one of said impurity regions; and a bit line formed on an inner surface of said opening and said interlayer insulating layer, and electrically connected to one of said impurity regions.

* * * * *